(12) United States Patent
Iwaida et al.

(10) Patent No.: US 7,089,659 B2
(45) Date of Patent: Aug. 15, 2006

(54) METHOD OF PRODUCING CERAMIC LAMINATES

(75) Inventors: Toshihiro Iwaida, Kokubu (JP); Seiichi Koizumi, Kokubu (JP)

(73) Assignee: Kyocera Corporation, Kyoto (JP)

( * ) Notice: Subject to any disclaimer, the term of this patent is extended or adjusted under 35 U.S.C. 154(b) by 440 days.

(21) Appl. No.: 10/155,702

(22) Filed: May 24, 2002

(65) Prior Publication Data

US 2003/0016484 A1 Jan. 23, 2003

(30) Foreign Application Priority Data

May 25, 2001 (JP) .............................. 2001-157699
Jun. 28, 2001 (JP) .............................. 2001-197119
Aug. 3, 2001 (JP) .............................. 2001-236376

(51) Int. Cl.
*H05K 3/36* (2006.01)

(52) U.S. Cl. ............................ 29/830; 29/825; 29/831; 29/846; 156/89.12; 156/313

(58) Field of Classification Search .......... 29/830–834, 29/25.42; 156/89.12, 89.16; 427/79, 98.4, 427/126.2; 264/6, 211
See application file for complete search history.

(56) References Cited

U.S. PATENT DOCUMENTS 5,480,503 A * 1/1996 Casey et al. ............. 156/89.18
5,700,548 A 12/1997 Warnier et al.
5,865,920 A * 2/1999 Sakuratani et al. ...... 156/89.16
5,935,358 A * 8/1999 Yamasaki ................ 156/89.12
6,475,317 B1 * 11/2002 Baba et al. ............... 156/89.12
2003/0016484 A1 * 1/2003 Iwaida et al. ............ 361/306.3

FOREIGN PATENT DOCUMENTS

| GB | 2 347 383 | 9/2000 |
| GB | 2 357 280 | 6/2001 |
| JP | 2-066916 | 3/1990 |
| JP | 3-105905 | 5/1991 |
| JP | 9-153429 | 6/1997 |
| JP | 11-186093 | 7/1999 |
| JP | 2000-311831 | 11/2000 |

* cited by examiner

*Primary Examiner*—Minh Trinh
(74) *Attorney, Agent, or Firm*—Hogan & Hartson LLP

(57) ABSTRACT

A method of producing ceramic laminates includes forming a ceramic green sheet by applying a ceramic slurry on a carrier film; forming, maintaining a predetermined gap, a plurality of electrically conducting patterns having inclined surfaces at the ends by printing an electrically conducting paste on the main surface of the ceramic green sheet; forming ceramic patterns having inclined surfaces at the ends among the electrically conducting patterns by printing a ceramic paste with a distance of not smaller than 10μm from the electrically conducting patterns; and laminating ceramic green sheets on which are formed the electrically conducting and ceramic patterns.

7 Claims, 8 Drawing Sheets

FIG.8
FIG.8(a)
FIG.8(b)
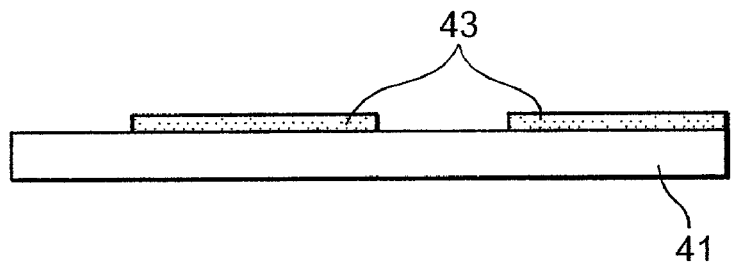
FIG.8(c)
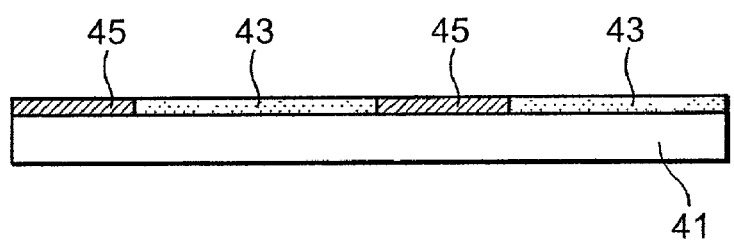
FIG.8(d)
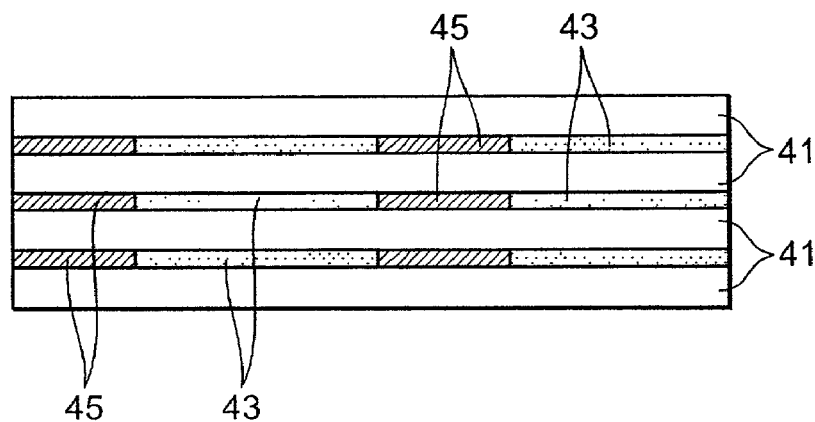

METHOD OF PRODUCING CERAMIC LAMINATES

BACKGROUND OF THE INVENTION

1. Field of the Invention

The present invention relates to a method of producing ceramic laminates, laminated electronic parts and a method of producing the parts. In particular, the invention relates to a method of producing ceramic laminates in which ceramic green sheets and electrically conducting patterns are laminated in many layers having small thicknesses like in a wiring board or a laminated ceramic capacitor, to electronic parts of a type in which many thin ceramic layers are laminated, and to a method of producing the same.

2. Description of the Related Art

Accompanying the trend toward realizing electronic devices in ever small sizes and in high densities in recent years, it has been urged to provide laminated electronic parts in small sizes having reduced thicknesses yet maintaining a high dimensional precision so as to be mounted in the electronic devices. In the field of wiring boards having electrically conducting patterns formed in the ceramic laminate and electronic parts such as laminated ceramic capacitors, efforts have been made to decrease the thickness of the electrically conducting patterns and to employ a multi-layered structure constituted by ceramic green sheets and inner electrode layers that serve as the dielectric ceramic layers from the standpoint of decreasing the weight, decreasing the thickness, decreasing the size and increasing the capacity.

In the ceramic laminate for the electronic parts, the thickness of the electrically conducting patterns formed on the ceramic green sheet exhibits an increasing effect as the thickness of the ceramic green sheets decreases and as the ceramic green sheets are laminated in an increased number one upon the other. Due to the thickness of the electrically conducting patterns, therefore, a difference in level builds up between the portions where the electrically conducting patterns are formed and the portions where they are not formed, resulting in a decrease in the adhesion among the ceramic green sheets in the portions where there is no electrically conducting pattern, and developing delamination and cracks.

Therefore, a contrivance has been made to eliminate a difference in level on the ceramic green sheet.

A method of producing such a ceramic laminate for electronic parts has been disclosed in, for example, Japanese Unexamined Patent Publication (Kokai) No. 311831/2000.

In the method of producing the ceramic laminates disclosed in this publication as shown in FIG. 9, ends 85 of electrically conducting patterns 83 are so formed as to possess inclined surfaces 87 defining an acute angle with respect to the main surface of a ceramic green sheet 81 in a step of forming the electrically conducting patterns 83 on the main surface of the ceramic green sheet 81, and a ceramic paste is applied so as to be overlapped on the inclined surfaces 87 of the electrically conducting patterns 83 in a step of applying the ceramic paste to the peripheries of the electrically conducting patterns 83.

According to the above production method, the inclined surface 87 are formed at the ends 85 of the electrically conducting patterns 83. Therefore, the ceramic paste applied so as to be overlapped on the inclined surfaces 87 quickly migrate into among the electrically conducting patterns 83 and is smoothly leveled without substantially creating a difference in level despite of the thickness of the electrically conducting patterns 83. Accordingly, the ceramic green sheets 81 can be laminated without being affected by the thickness of the electrically conducting patterns 83.

To decrease the cost of electronic parts in recent years, however, a large number of ceramic laminates are taken out from a mother laminate. For this purpose, the ceramic green sheet 81 and the printing screen are now being produced having large work sizes. For example, there has been used a printing screen in which semiconductor patterns each having an area of about not larger than $1 \times 2$ mm$^2$ are arranged maintaining a gap of not larger than about 0.5 mm, the effective size of the printing screen being not smaller than $150 \times 150$ mm$^2$.

When the ceramic paste is printed by using the printing screen having such a large effective size, the elongation factor thereof becomes large toward the peripheral portions of the printing screen as compared to the central portion due to the pressure of printing, resulting in an increase in the positional deviation of the ceramic patterns 89 formed among the electrically conducting patterns that have been formed in advance on the ceramic green sheet 81 and, particularly, among the electrically conducting patterns 83 formed in the peripheral portions.

That is, the printing screen has a structure in which the outer periphery of the screen is secured to a frame of a rectangular shape, and effects the printing by moving a blade from one end of the screen toward the other end thereof while being pushed onto the screen. As the blade is pushed onto the screen and is moved, however, the elongation of the screen becomes great toward the peripheral portions as compared to the central portion, and the deviation in the position of printing the ceramic pattern 89 increases toward the peripheral portions.

In the method of producing the ceramic laminate for electronic parts disclosed in the above Japanese Unexamined Patent Publication (Kokai) No. 311831/2000, the ceramic paste is applied so as to be overlapped on the inclined surfaces 87 of the electrically conducting patterns 83, and the ceramic paste applied onto the ends 85 of the electrically conducting patterns 83 migrate into among the electrically conducting patterns 83 and is leveled. As described above, the ceramic paste printed by using the peripheral portions of the printing screen is greatly deviated in position. Even if the position of the printing screen is so controlled that the ceramic paste is just applied onto, or applied slightly riding on, the ends 85 of the electrically conducting paste prior to effecting the printing, the ceramic paste is not just or suitably overlapped on the inclined surfaces at the ends of the electrically conducting paste in the peripheral portions of the printing screen, arousing a problem in that the ceramic paste is applied greatly riding on the ends 85 of the electrically conducting patterns 83.

Accordingly, the ceramic pattern 89 swells on the flat portions 91 near the ends 85 of the electrically conducting patterns 83. The thickness locally increases in the portions printed by using the peripheral portions of the printing screen, and the ceramic laminate develops delamination and cracks.

That is, according to Japanese Unexamined Patent Publication (Kokai) No. 311831/2000, the ceramic paste is applied onto the inclined surfaces 87 of the electrically conducting paste. Therefore, if the position of the printing screen is strictly controlled, the ceramic paste can be applied to be just or suitably overlapped onto the inclined surfaces 87 of the electrically conducting patterns in the central portion of the printing screen. In the peripheral portions, however, the ceramic paste is printed onto the flat portions 91 of the electrically conducting patterns 83. In the portions where the ceramic paste is applied onto the ends 85 of the electrically conducting patterns 83, the solvent contained in the ceramic paste infiltrates into the electrically conducting patterns 83 which are porous after the printing has been finished. Therefore, the ceramic paste is partly deposited on the flat portions 91 near the ends 85 of the electrically conducting patterns 83 causing the thickness to increase in these portions.

When the ceramic green sheets 81 on which the electrically conducting patterns 83 and the ceramic patterns 89 are formed as described above, are laminated in a number of, for example, not smaller than 100 layers and, particularly, not smaller than 200 layers, the thickness increases at the ends 85 of the electrically conducting patterns 83. Accordingly, the adhesion decreases among the ceramic green sheets at portions printed in the peripheries of the printing screen, developing cracks and delamination after firing, and decreasing the yield.

In the laminate of electronic part (laminated ceramic capacitor) disclosed in the above Japanese Unexamined Patent Publication (Kokai) No. 311831/2000, further, the dielectric patterns formed for eliminating a difference in level caused by the inner electrode layers are formed of a material having a composition same as the dielectric green sheet. Therefore, the coefficient of contraction due to firing of the dielectric patterns in the direction of thickness is smaller than the coefficient of contraction due to firing of the inner electrode layers in the direction of thickness, whereby the junction strength becomes weak on the interface between the dielectric ceramic layers and the inner electrode layers, developing delamination in the peripheries of the inner electrode layers.

Further, since the junction strength is weak on the interface between the dielectric ceramic layers and the inner electrode layers, cracks occur in the peripheries and at the ends of the inner electrode layers of the laminated electronic part at the time of soldering or thermal shock testing.

The delamination and cracks occur easily as the thickness of the dielectric ceramic layers decreases due to a difference in the contraction by firing between the dielectric ceramic layers and the inner electrode layers, and occur more easily when the thickness of the dielectric ceramic layers is not larger than 3 μm.

SUMMARY OF THE INVENTION

It is therefore an object of the present invention to provide a method of producing ceramic laminates, which is capable of suppressing the ceramic laminates from being deformed and is further capable of suppressing the occurrence of delamination and cracks even when the thickness of the ceramic green sheets is decreased and the number of the laminated layers is increased.

It is another object of the present invention to provide a laminated electronic part which eliminates a difference in level caused by the thickness of the inner electrode layers and suppresses the occurrence of cracks and delamination even when the thickness of the dielectric ceramic layers formed of the ceramic green sheets is decreased and the number of the laminated layers is increased, and to provide a method of producing the same.

A first method of producing ceramic laminates according to the present invention comprise the steps of:

forming a ceramic green sheet by applying a ceramic slurry onto a carrier film;

forming, maintaining a predetermined gap, a plurality of electrically conducting patterns having inclined surfaces at the ends thereof by printing an electrically conducting paste onto the main surface of said ceramic green sheet;

forming ceramic patterns having laminated surfaces at the ends thereof among said electrically conducting patterns by printing a ceramic paste maintaining a distance of not smaller than 10 μm from said electrically conducting patterns; and laminating ceramic green sheets on which are formed said electrically conducting patterns and said ceramic patterns.

According to this constitution, ceramic patterns are formed among the electrically conducting patterns eliminating almost all of the difference in level, suppressing the ceramic green sheets from falling down among the electrically conducting patterns even when the ceramic green sheets are laminated, suppressing the ceramic laminate from being deformed, and preventing the occurrence of delamination and cracks.

Besides, the ceramic paste is applied maintaining a distance so will not to be overlapped on the inclined surfaces at the outer peripheral ends of the electrically conducting patterns. Therefore, even when the ceramic paste is expanded up to the peripheral portions due to the pressure of the printing screen and the position is deviated during the printing, a margin is provided for maintaining positional precision between the electrically conducting patterns and the ceramic patterns, making it possible to reliably form the ceramic patterns among the electrically conducting patterns. Even when a ceramic laminate is formed by laminating many number of ceramic green sheets on which the electrically conducting patterns and ceramic patterns are formed, the ceramic laminate is suppressed from being deformed.

In the method of producing ceramic laminates, the angle $\theta_1$ subtended by the inclined surface at the end of the electrically conducting pattern and by the inclined surface at the end of the ceramic pattern is selected to lie within a range of from 120° to 179° in order to further decrease the dents among the electrically conducting patterns and the ceramic patterns.

Upon forming greatly inclined surfaces at the ends of the electrically conducting patterns and of the ceramic patterns that are facing each other, further, the dents between the electrically conducting patterns and the ceramic patterns are further decreased when the thin electrically conducting patterns are formed. When the ceramic green sheets forming the electrically conducting patterns and the ceramic patterns are laminated, therefore, the ceramic green sheets are suppressed from being buried among the patterns, and the ceramic laminate is suppressed from being deformed.

In the method of producing ceramic laminates according to the first invention, it is desired that the angle $\theta_2$ of the inclined surface at the end of the ceramic pattern lies within a range of from 0.5° to 40°.

Upon decreasing the angle of the inclined surface, the ceramic green sheets are suppressed from falling down between the two patterns when the ceramic green sheets are laminated with the application of pressure even when the electrically conducting patterns and the ceramic patterns are formed maintaining a distance. Therefore, the ceramic laminate is suppressed from being deformed.

In the method of producing ceramic laminates according to the first invention, it is desired that when a viscosity of the ceramic paste at a shearing rate of 0.01 s$^{-1}$ is denoted by $\eta_1$ and a viscosity of the ceramic paste at a shearing rate of 100 s$^{-1}$ is denoted by $\eta_2$, there holds a relation $\eta_1/\eta_2 > 5$.

By using the ceramic paste having a large yield value and exhibiting such viscosity characteristics that the viscosity greatly changes during the printing, it is made possible to improve the shape retentivity of the ceramic patterns even in the ceramic green sheets on which the electrically conducting patterns have been formed in advance without permitting the ceramic paste to infiltrate into the electrically conducting patterns and, hence, to highly precisely form the ceramic patterns maintaining a predetermined gap among the electrically conducting patterns.

In the method of producing ceramic laminates according to the first invention, it is desired that a difference in the SP value between an organic binder contained in the ceramic paste and an organic binder contained in the ceramic green sheet is not larger than 2.

Upon bringing the SP value of the sticking agent used in the ceramic paste close to the SP value of the sticking agent used in the ceramic green sheet, compatibility is improved between them, adhesiveness is improved, and the ceramic laminate is prevented from being delaminated.

In the method of producing ceramic laminates, it is desired that the electrically conducting patterns have a thickness which is not larger than 3 μm.

In recent years, the ceramic green sheet has been formed maintaining a thickness of not larger than 4 μm and the electrically conducting pattern, too, has been formed maintaining a thickness of not larger than 3 μm. However, since the outer peripheral ends of the electrically conducting patterns and the ends of the ceramic patterns have been inclined, the dents formed between the electrically conducting patterns and the ceramic patterns become negligibly small, making it possible to substantially eliminate a difference in level and to prevent the occurrence of delamination or cracks.

Further, if the thickness of the electrically conducting patterns is substantially the same as the thickness of the ceramic patterns, the surfaces of the laminate can be flattened.

Next, a second method of producing ceramic laminates according to the present invention comprises the steps of:

forming a plurality of electrically conducting patterns maintaining a predetermined distance on the main surface of a ceramic green sheet by printing an electrically conducting paste thereon;

forming an organic resin film on the upper surface of the ceramic green sheet among said electrically conducting patterns and on the upper surfaces of said electrically conducting patterns in the vicinities thereof;

forming ceramic patterns on said organic resin film among said electrically conducting patterns by applying a ceramic paste thereon;

forming a temporarily laminated article by laminating a plurality of ceramic green sheets on which said electrically conducting patterns, said organic resin film and said ceramic patterns are formed; and forming a laminate by pressing said temporarily laminated article while heating it at a temperature at which said organic resin film melts.

According to this constitution, the organic resin film is formed on the upper surface of the ceramic green sheet among the electrically conducting patterns and on the upper surfaces of the electrically conducting patterns in the vicinities thereof. Therefore, even when the ceramic patterns are formed riding on the upper surfaces at the ends of the electrically conducting patterns due to a deviation in the printing, the organic resin film melts due to the heat and pressure at the time of lamination, and the ceramic patterns formed riding on the upper surfaces migrate to among the electrically conducting patterns together with the organic resin film that flows into among the electrically conducting patterns. Accordingly, the ceramic patterns are suppressed from being overlapped on the upper surfaces at the ends of the electrically conducting patterns, and the ceramic laminate after firing is suppressed from being deformed, preventing the occurrence of delamination and voids.

In the method of producing ceramic laminates according to the second invention, it is desired that the organic resin film has a thickness of not smaller than 20 nm.

When the organic resin film has a thickness of not smaller than 20 nm, it is allowed to continuously form an organic resin film while covering ruggedness on the surfaces at the ends of the electrically conducting patterns, suppressing the ceramic paste from infiltrating into the electrically conducting patterns, and enabling the ceramic patterns to easily migrate to among the electrically conducting patterns during the heating and pressing.

In the method of producing ceramic laminates according to the second invention it is desired that a glass transition point of the resin component constituting the organic resin film is lower than a glass transition point of the resin component contained in the ceramic patterns and in the electrically conducting patterns.

By selecting the glass transition point of the resin component contained in the organic resin film to be lower than the glass transition point of the resin component contained in the ceramic patterns and in the electrically conducting patterns, it is allowed to melt the organic resin film during the heating and pressing, to easily migrate the ceramic patterns into among the electrically conducting patterns and to suppress the ceramic laminate from being deformed.

In the method of producing ceramic laminates according to the second invention, the organic resin film is formed by using a solution containing the resin component in an amount of from 1 to 50% by weight, making it easy to adjust the viscosity of the slurry that is to be applied for forming the organic resin film, and enabling the organic resin film that is formed to be highly leveled.

In the method of producing ceramic laminate according to the second invention, the thickness of the electrically conducting patterns is substantially the same as the thickness of the ceramic patterns to flatten the surface of the laminate.

Next, a laminated electronic part according to a third invention is the one in which:

non-capacity portions constituted by dielectric ceramic layers and inner electrode layer-extending portions formed by extending inner electrode layers, are formed integrally on the side surfaces of a capacity portion constituted by alternately laminating the dielectric ceramic layers and the inner electrode layers; and a pair of outer electrodes are provided for said non-capacity portions so that said inner electrode layer-extending portions are alternately connected thereto;

wherein said inner electrode layers and said inner electrode layer-extending portions are forming a flush surface without substantially a difference in level, and the dielectric ceramic layers in said non-capacity portions are constituted by ceramics which can be more highly sintered than the dielectric ceramic layers in said capacity portion.

This constitution eliminates a difference in level caused by the inner electrode layer-extending portions in the non-capacity portions. Besides, the non-capacity portions are more highly sintered than the capacity portion, making it possible to enhance the density and mechanical strength of the non-capacity portions and to prevent the occurrence of delamination and cracks in the peripheries of the inner electrode layers.

In the laminated electronic part, the dielectric ceramic layers in the capacity portion and in the non-capacity portions comprise dielectric particles and a glass phase, and the amount of the glass contained in the dielectric ceramic layers in said non-capacity portions is larger than the amount of the glass contained in the dielectric ceramic layers in the capacity portion.

Upon having the glass existing among the dielectric particles in the dielectric ceramic layers constituting the capacity portion and the non-capacity portions, it is allowed to control the sintering property of the dielectric ceramic layers that constitute the capacity portion and the non-capacity portions without affecting the dielectric properties. By introducing the glass into the non-capacity portions in an amount larger than that in the capacity portion, in particular, the sintering property in the non-capacity portions can be heightened.

In the laminated electronic part, it is desired that the dielectric particles constituting the dielectric ceramic layers in the non-capacity portions have an average particle diameter smaller than the average particle diameter of the dielectric particles constituting the dielectric ceramic layers in the capacity portion.

By selecting the average particle diameter of the dielectric particles in the dielectric ceramic layers constituting the non-capacity portions to be smaller than the average particle diameter of the dielectric particles of the dielectric ceramic layers constituting the capacity portion, it is allowed to further enhance the sintering property and mechanical strength of the non-capacity portions and to prevent the occurrence of cracks.

A method of producing laminated electronic parts according to a fourth invention comprises the steps of:

forming a plurality of inner electrode patterns maintaining a predetermined distance on the main surface of a dielectric green sheet containing a dielectric powder by printing a paste for forming inner electrodes thereon;

forming dielectric patterns having a thickness substantially the same as that of said inner electrode patterns among said inner electrode patterns by printing a dielectric paste of a material containing at least a dielectric powder and a glass powder and having a sintering property higher than that of said dielectric green sheet; and laminating a plurality of dielectric green sheets on which said inner electrode patterns and said dielectric patterns are formed.

According to this constitution in which dielectric patterns are formed among the inner electrode patterns, a difference in level caused by the inner electrode patterns is easily eliminated. Besides, even when the dielectric green sheets are laminated in a plural number, the dielectric green sheets are suppressed from falling down among the inner electrode patterns preventing the laminated electronic part from being deformed.

Further, since the dielectric patterns are highly sintered, the junction strength can be easily enhanced among the dielectric ceramic layers and the inner electrode layers in the non-capacity portions, preventing the occurrence of delamination and cracks.

In the method of producing laminated electronic parts, a softening point of the glass powder contained in the dielectric patterns in lower than a softening point of the glass powder contained in the dielectric green sheets, making it easy to enhance the coefficient of contraction of the non-capacity portions through firing and to improve the density.

In the method of producing laminated electronic parts, the dielectric powder contained in the dielectric paste has an average particle diameter smaller than an average particle diameter at the dielectric powder contained in the dielectric green sheets, making it easy to enhance the coefficient of contraction of the non-capacity portions through firing, to improve the density, to further improve the sintering property and mechanical strength of the dielectric ceramic layers constituting the non-capacity portions as compared to those of the dielectric ceramic layers constituting the capacity portion, and to prevent the occurrence of cracks.

BRIEF DESCRIPTION OF THE DRAWINGS

FIG. 8 is a view illustrating the steps for producing the laminated electronic part according to the third invention.

DETAILED DESCRIPTION OF THE PREFERRED EMBODIMENTS

Preferred embodiments of the methods of producing ceramic laminates according to the first and second inventions, preferred embodiments of the laminated electronic part of the third invention, and preferred embodiments of the method of producing the electronic part of the fourth invention, will now be concretely described in this order with reference to the drawings.

First, the method of producing the ceramic laminate of the first invention is applied to a laminated ceramic capacitor which is an electronic part.

Figure 1:
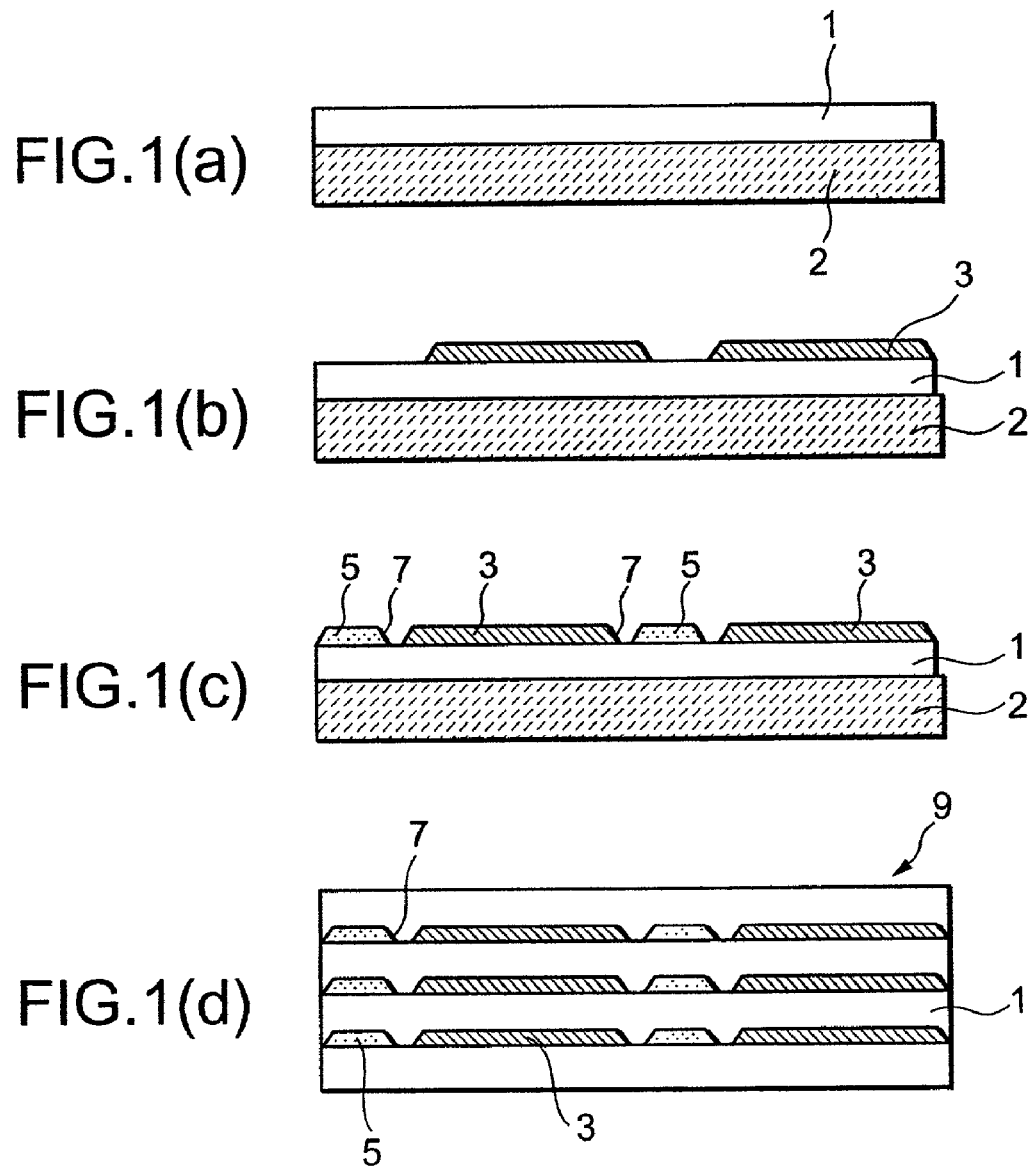
FIG. 1 is a view illustrating the steps for producing a ceramic laminate according to a first invention.

Referring to FIG. 1(a), a ceramic green sleet 1 that constitutes the laminated ceramic capacitor is formed by applying a ceramic slurry onto a carrier film 2.

Referring next to FIG. 1(b), a plurality of electrically conducting patterns 3 are formed maintaining a predetermined distance on one main surface of the ceramic green sheet 1 by printing an electrically conducting paste thereon.

Referring further to FIG. 1(c), ceramic patterns 5 having substantially the same thickness as the electrically conducting patterns 3 are formed among the electrically conducting patterns 3 by printing a ceramic paste so as to substantially eliminate a difference in level caused by the thickness of the electrically conducting patterns.

Next, referring to FIG. 1(d), the ceramic green sheets 1 forming the electrically conducting patterns 3 and the ceramic patterns 5 thereon, are laminated in a plural number to obtain a mother laminate 9. The mother laminate 9 is, then, cut to obtain ceramic laminated articles.

The mother laminate 9 is cut and is fired in a predetermined atmosphere under predetermined temperature conditions to foam a plurality of laminated ceramic capacitors which are ceramic laminates.

Figure 2:
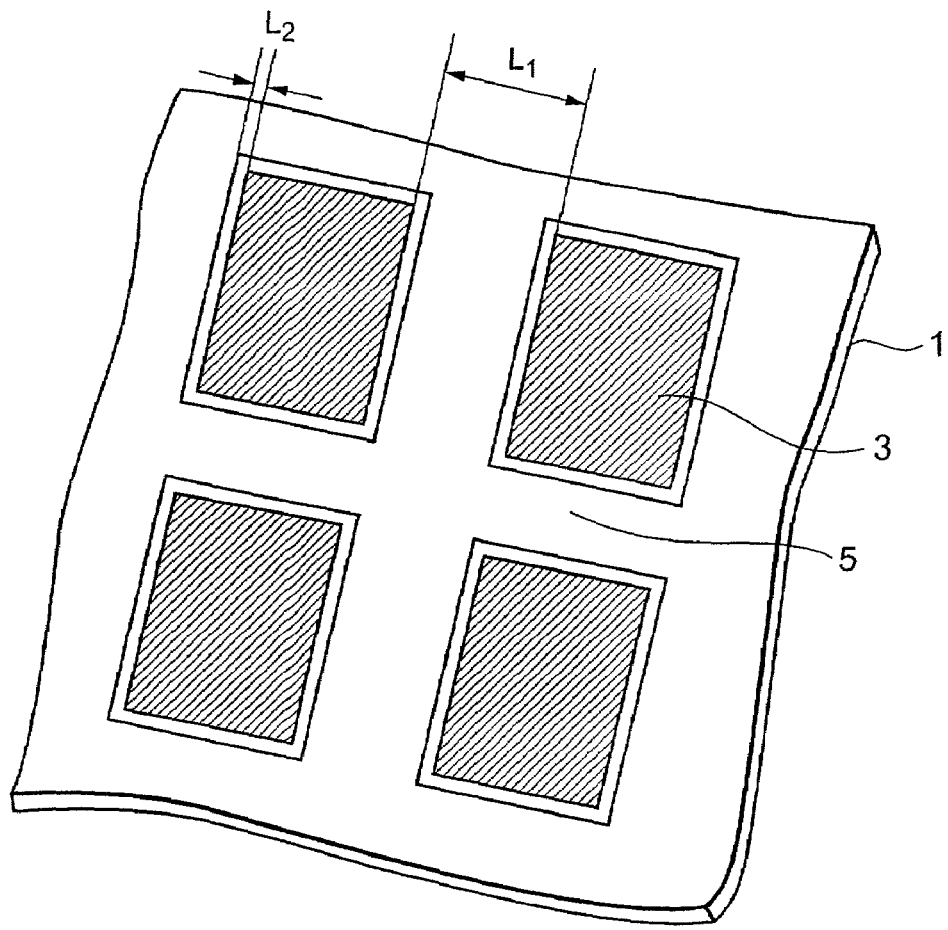
FIG. 2 is a perspective view schematically illustrating ceramic patterns formed maintaining a distance among the electrically conducting patterns on a ceramic green sheet according to the first invention.

In the ceramic green sheet 1 forming the electrically conducting patterns 3 and the ceramic patterns 5 as described above, a plurality of rectangular electrically conducting patterns 3 are formed as shown in FIG. 2 maintaining a predetermined gap $L_1$ by printing an electrically conducting paste onto one main surface of the ceramic green sheet 1, and the ceramic patterns 5 are formed among the electrically conducting patterns 3 by printing a ceramic paste to substantially eliminate a difference in level caused by the thickness of the electrically conducting patterns 3.

Figure 3:
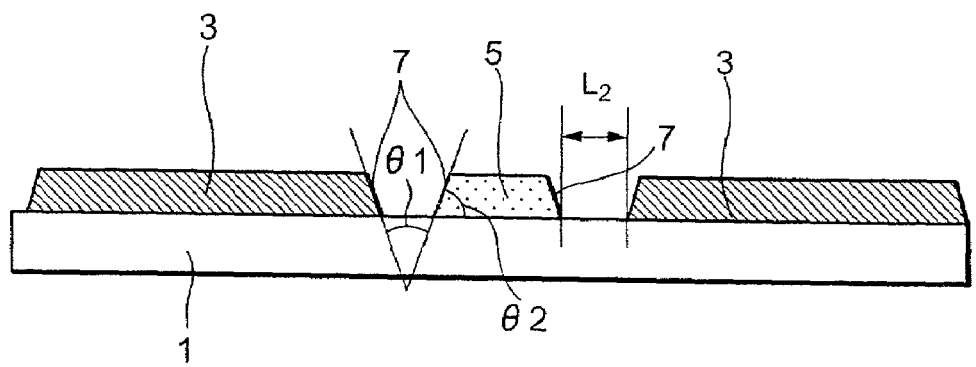
FIG. 3 is a sectional view schematically illustrating the ceramic patterns formed maintaining a distance among the electrically conducting patterns on a ceramic green sheet according to the first invention.

Referring to FIG. 3, further, inclined surfaces 7 are formed at the outer peripheral ends of the electrically conducting patterns 3 and of the ceramic patterns 5 formed on the surface of the ceramic green sheet 1.

It is desired that the angle $\theta_2$ of the inclined surfaces at the ends of the ceramic patterns 5 with respect to the ceramic green sheet 1 is in a range of from 0.5° to 40°. When the laminate is pressed, in particular, it is desired that the angle $\theta_2$ is from 1° to 20° and, more desirably, from 2° to 10° from the standpoint of suppressing the ceramic green sheets from being buried among the patterns and suppressing the ceramic laminate from being deformed.

To form the above inclined surfaces, it is necessary that the ceramic paste has thixotropic viscosity characteristics.

It is further desired that the ceramic patterns 5 are formed among the electrically conducting patterns 3 maintaining a gap $L_2$ of not smaller than 10 μm to the electrically conducting patterns 3 which are formed maintaining a distance $L_1$ among themselves.

It is desired that the gap $L_2$ is not smaller than 30 μm from the standpoint of maintaining a margin in the positional precision between the conductor patterns 3 and the ceramic pattern 5 and forming a pattern maintaining a high precision despite of deviation in the position at the time of printing. More desirably, the gap $L_2$ is in a range of from 30 to 150 μm from the standpoint of suppressing the ceramic green sheets 1 from being buried between the patterns when the ceramic green sheets 1 are laminated and pressed and of suppressing the ceramic laminate from being deformed.

Despite the ceramic patterns 5 are formed among the conductor patterns 3 to eliminate a difference in level caused by the thickness of the conductor patterns 3, there exists a small gap between the electrically conducting patterns 3 and the ceramic patterns 5. When the ceramic green sheets 1 forming the electrically conducting patterns 3 and the ceramic patterns are laminated in many number to form a ceramic laminate, therefore, the air trapped among the ceramic green sheets 1 can be effectively removed while the ceramic green sheets 1 are being temporarily laminated with the application of pressure.

It is further desired that the angle $\theta_1$ between the inclined surface 7 at the end of the electrically conducting pattern 3 and the inclined surface 7 at the end of the ceramic pattern 5 is in a range of from 120° to 179° and, particularly, in a range of from 135° to 178° from the standpoint of suppressing the ceramic green sheets 1 from being buried between the patterns when the ceramic green sheets 1 are laminated and pressed and, more particularly, in a range of from 150° to 170° from the standpoint of improving the adhesion.

The angles $\theta_1$ and $\theta_2$ are easily found by measuring the electrically conducting patterns 3 and the ceramic patterns 5 formed on the ceramic green sheet by using a probe-type surface roughness meter. More precisely, the angles can be measured by observing the cross sections by using a scanning electron microscope.

First, a ceramic slurry is applied onto the carrier film to form a ceramic green sheet relying on the slip casting method.

As a carrier film, there is used the one which is, for example, a PET film. In order for the thin ceramic green sheets to be favorably peeled off, it is desired that the films are subjected to the parting processing by coating the surfaces thereof with a silicone resin.

As the ceramic slurry, there is preferably used a mixture of, for example, a ceramic powder, a binder of a polyvinyl butyral resin, and a mixture of toluene and ethyl alcohol as a solvent for dissolving the binder.

As another binder, there can be used an acrylic resin from the standpoint of dispersion in the ceramic powder and in the solvent, strength of the ceramic green sheet and removal of the binder.

As a concrete example of the ceramic material, there can be used a ceramic powder such as of $BaTiO_3$—Mno—Mgo—$Y_2O_3$ because of its anti-reducing property.

Further, a glass powder may be added.

It is desired that the ceramic powder used for the ceramic green sheet has a particle diameter which is not larger than 1.5 μm from the standpoint of decreasing the thickness of the ceramic green sheets, and is from 0.1 to 0.9 μm from the standpoint of exhibiting a large dielectric constant and a highly insulating property.

The $BaTiO_3$ powder which is the main starting material of the ceramic powder to synthesized by a solid phase method, a liquid phase method (passing through an oxalic acid) or a hydrothermally synthesizing method. Among them, the hydrothermally synthesized method is desired from the standpoint of narrow particle size distribution and high degree of crystallinity.

It is desired that the $BaTiO_3$ powder has an average specific surface area of from 1.1 to 10 $m^2/g$.

Concrete examples of the slip casting method may include pulling method, doctor blade method, reverse roll coater method, gravure coater method, screen printing method, gravure printing method and die coater method.

In the method of producing the ceramic laminate, the ceramic slurry applied onto the carrier film that is subjected to the parting processing, is heated and dried at a temperature of from room temperature up to a temperature of not lower than the vaporization temperature of the solvent in any step.

The heating temperature is varied stepwise such as room temperature, 60° C., 100° C. which is higher than the vaporization temperature of the solvent.

Upon conducting the heating stepwise as described above, the solvent is evenly or gradually vaporized from the liquid slurry film, and the surfaces or the peeled surfaces do not become tough which otherwise is caused by traces left as the solvent is boiled by rapid drying at high temperatures.

In the final zone of the dried portion, further, the drying temperature has been set to be not lower than the vaporization temperature of the solvent. Therefore, no binder precipitates or no binder coagulates which otherwise is caused by drying at low temperatures for extended period of time, and there is formed a homogeneous ceramic green sheet free of such defects as pinholes and cuts in the film.

It is desired that the ceramic green sheet 1 has a thickness of from 1.5 to 4 μm from the standpoint of accomplishing a large capacity despite of a small size.

Next, on the ceramic green sheet 1 that is prepared are formed electrically conducting patterns by printing the electrically conducting paste thereon by screen printing, gravure printing or the like method.

The electrically conducting paste contains an organic solvent which is a mixture of metal particles, aliphatic hydrocarbous and a higher alcohol; an organic sticking agent comprising an ethyl cellulose which is soluble in the organic solvent; and an organic sticking agent comprising an epoxy resin which is sparingly soluble in the organic solvent.

The viscosity of the electrically conducting paste can be controlled by properly adjusting the metal powder, sticking agent, solvent and dispersing agent in the electrically conducting paste, thereby to impart thixotropic property to the electrically conducting paste.

Upon controlling the viscosity of the electrically conducting paste, the inclined surface 7 is formed at the end of the electrically conducting pattern 3 while controlling the angle thereof.

The metal particles contained in the electrically conducting paste are base metal particles having an average particle diameter of from 0.05 to 0.5 μm.

As the base metal, there can be used nickel, cobalt or copper. Among them, however, nickel is desired from such a standpoint that the temperature for firing the metal is in agreement with the temperature for firing inculators in general and that the cost is low.

It is desired that the base metal particles have an average particle diameter in a range of from 0.1 to 0.5 μm from the standpoint of improving the dispersion of the metal powder and preventing the metal from being aggregated during the firing.

From the standpoint of forming a metal film which is dense having a smooth surface, it is desired that the base metal has an average particle diameter of from 0.15 to 0.4 μm.

It is further desired that the electrically conducting paste is used being mixed with a fine ceramic powder for suppressing the sintering property of the electrically conducting pattern in addition to being mixed with the metal powder as a solid component. From the standpoint of forming the electrically conducting patterns 3 having a uniform particle diameter and improving the smoothness, it is desired that the ceramic powder has a particle diameter of from 0.05 to 0.3 μm.

It is desired that the electrically conducting patterns 3 have a thickness of not larger than 3 μm and, particularly, not larger than 1 μm from the standpoint of decreasing the size of the capacitor yet maintaining high reliability.

The binder composition of the ceramic paste may be either the one of the same composition as the electrically conducting paste forming the electrically conducting patterns 3 or the one of the ceramic paste of a different composition. Particularly, however, it is desired that the ceramic paste has the same composition as the electrically conducting paste from the standpoint of employing the same conditions as those for printing the electrically conducting paste and bringing the rate of volatilization of the sticking agent from the surface of the ceramic green sheet 1 into agreement.

Further, the ceramic powder composition used for the ceramic slurry may be either the powder composition of the ceramic green sheet 1 or the ceramic paste of a different powder composition. From the standpoint of enhancing the adhesion between the ceramic green sheet 1 and the ceramic pattern and bringing the coefficient of contraction due to firing into agreement, however, it is desired that the ceramic paste has the same composition as the ceramic slurry for forming the ceramic green sheet 1.

It is desired that the ratio of materials contained in the ceramic slurry is not larger than 80% and it is, particularly, desired that the amount of solvent is from 20 to 70% by weight from such a standpoint that the solvent does not infiltrate into the neighboring electrically conducting patterns.

The solvent used here, too, is desirably the same as the solvent used for the electrically conducting paste.

In order to form such ceramic patterns, it is desired that the ceramic paste exhibits thixotropic viscosity characteristics and, besides, when a viscosity of the ceramic paste at a shearing rate of $0.01$ s$^{-1}$ is denoted by $\eta_1$ and a viscosity of the ceramic paste at a shearing rate of $100$ s$^{-1}$ is denoted by $\eta_2$, there holds a relation $\eta_1/\eta_2 > 5$. From the standpoint of suppressing the ceramic patterns from being deformed, further, it is desired that the ceramic paste has such viscosity characteristics that $\eta_1/\eta_2$ is in a range of from 10 to 50 over the above-mentioned range of shearing rates in order to improve the shape-retaining property without infiltrating into the electrically conducting patterns and to highly precisely form the ceramic patterns among the electrically conducting patterns maintaining a predetermined gap.

The viscosity of the ceramic paste works to properly control the ceramic powder, sticking agent, solvent and dispersant in the ceramic paste thereby imparting thixotropic property to the ceramic paste.

Upon controlling the viscosity characteristics of the ceramic paste as described above, it is allowed to form inclined surfaces 7 at the ends of the ceramic patterns 5 and to control the angle thereof.

The viscosity of the ceramic slurry is measured by using a viscometer of the cone type having a diameter of 50 mm and of which the cone angle is set to 1° (RS-150 manufactured by Haake Co.).

It is desired that a difference in the SP value between an organic binder contained in the ceramic paste and an organic binder contained in the ceramic green sheets 1 is not larger than 2 and is, particularly, in a range of from 0 to 1.5 from the standpoint of enhancing the adhesion between the ceramic green sheets and the ceramic patterns 5.

In producing the ceramic laminate of the present invention, gaps are formed between the electrically conducting patterns and the ceramic patterns of the ceramic green sheets that are temporarily laminated, enabling the air to be easily removed.

According to the first invention as described above, the ceramic paste is applied maintaining a distance so will not to be overlapped on the inclined surfaces 7 at the ends of the electrically conducting patterns 3. Even in case the position is deviated during the printing, therefore, a margin helps properly maintain a positional precision between the electrically conducting patterns 3 and the ceramic patterns 5. Therefore, no ceramic paste rides over the outer peripheral ends of the electrically conducting patterns and the thickness of these portions is suppressed from increasing. Even when the ceramic green sheets 1 forming the electrically conducting patterns and the ceramic patterns are laminated in many number one upon the other, therefore, the ceramic laminate is suppressed from being deformed preventing the occurrence of delamination and cracks.

Next, the method of producing ceramic laminates according to the second invention will be described with reference to the case of producing a laminated ceramic capacitor like in the case of the above-mentioned first invention.

In the method of the second invention, the ceramic green sheet 1 is formed by applying a ceramic slurry onto a carrier film 2 like in the first invention as shown in FIG. 4(*a*).

As the carrier film 2, there is used the one same as that of the first invention. In order for the carrier film 2 to be favorably peeled off the ceramic green sheet 1, it is desired that the carrier film 2, too, is subjected to the parting processing for its surfaces like in the first invention.

The ceramic slurry, too, is one same as that of the first invention. Preferably, there are used such resin components as ceramic powder and polyvinyl butyral, and a mixed solvent such as of toluene and ethyl alcohol.

As a further resin component, there can be used an acrylic resin from the standpoint of dispersion in the ceramic powder and in the solvent, strength at the ceramic green sheets and removal of the binder.

The polyvinyl butyral and acrylic resin which are the resin components used here have glass transition points of about 80° C. and about 0° C., respectively.

As the ceramic material, there can be used such a ceramic powder as $BaTiO_3$—MnO—MgO—$Y_2O_3$ like in the first invention.

There may be further added a glass powder.

Preferably, further, the ceramic powder has the same average particle diameter as that of the first invention.

The slip casting method may be the one exemplified in the first invention.

In any step, the ceramic slurry applied onto the carrier film 2 subjected to the parting processing is heated and dried at a temperature of from room temperature up to not lower than the vaporization temperature of the solvent like in the first invention, and is heated stepwise like room temperature, 60° C., 100° C.

It is desired that the thickness of the ceramic green sheet 1 is from 1.5 to 4 μm from a the standpoint of accomplishing a large capacity yet maintaining a small size.

Referring next to FIG. 4(*b*), a plurality of electrically conducting patterns 3 are formed maintaining a predetermined gap on the ceramic green sheet that is prepared by printing the electrically conducting paste by such a method as screen printing or gravure printing.

Here, it is desired that the outer peripheral ends of the electrically conducting patterns 3 formed on the surface of the ceramic green sheet 1 have inclined surfaces 7 inclined toward the electrically conducting patterns 3.

This is because the organic resin film 4 that is melted when the temporarily laminated article is heated and pressed, tends to easily migrate into among the electrically conducting patterns 3.

The electrically conducting paste, too, contains the metal powder, mixed organic solvent, ethyl cellulose resin component, epoxy resin component and dispersant like in the first invention.

The ethyl cellulose has a glass transition point of about 50° C.

The viscosity of the electrically conducting paste can be controlled by properly adjusting the metal powder, resin component, organic solvent and dispersing agent in the electrically conducting paste, thereby to impart thixotropic property to the electrically conducting paste.

Upon controlling the viscosity characteristics of the electrically conducting paste, the inclined surfaces 7 are formed at the ends of the electrically conducting patterns 3 while controlling the angle thereof.

The metal powder contained in the electrically conducting paste is a base metal powder same as the one used in the first invention.

It is further desired that the electrically conducting paste is used being mixed with a fine ceramic powder for suppressing the sintering property of the electrically conducting pattern in addition to being mixed with the metal powder as a solid component. From the standpoint of forming the electrically conducting patterns 3 having a uniform particle diameter and improving the smoothness, it is desired that the ceramic powder has an average particle diameter of from 0.05 to 0.3 μm.

It is desired that the electrically conducting patterns 3 have a thickness of not larger than 3 μm and, particularly, not larger than 1 μm from the standpoint of decreasing the size of the capacitor yet maintaining high reliability.

In the second invention as shown in FIG. 4(*c*), it is important to form an organic resin film 4 on the upper surface of the ceramic green sheet 1 among the electrically conducting patterns 3 and on the upper surfaces of the electrically conducting patterns 3 in the vicinities thereof by applying a slurry for forming the organic resin film.

It is further desired to form the organic resin film 4 on the upper surface of the ceramic green sheet 1 among the electrically conducting patterns 3 and on the whole surfaces of the electrically conducting patterns 3, since this eliminates the need of controlling the pattern of the organic resin film 4.

As the slurry for forming the organic resin film, there can be preferably used a resin component of the polyvinyl butyral resin which is the same material as the ceramic slurry and a mixture of toluene and ethyl alcohol as an organic solvent for dissolving the resin component.

As a further resin component, there can be used an acrylic resin instead of the polyvinyl butyral in order to lower the glass transition point.

In order to lower the glass transition point, further, the amount of the plasticizer may be increased.

It is desired that the amount of the resin component contained in the organic resin film 4 after drying is from 1 to 50% by weight and, particularly, from 10 to 30% by weight from the standpoint of enhancing the leveling and eliminating dispersion in the thickness.

When the amount of the resin component is not larger than 1% by weight, the thickness of the organic resin film 4 becomes too small and the electrically conducting pattern 3 may ooze out due to an excess of solvent. When the amount of the resin component is not smaller than 50% by weight, on the other hand, a viscosity suited for the application is not obtained, and a stable organic resin film 4 is not obtained.

It is desired that the organic resin film has a thickness of not smaller than 20 nm. From the standpoint of covering ruggedness of the electrically conducting patterns 3 and maintaining the features as thin layers of the ceramic green sheet 1 and the electrically conducting patterns 3, in particular, it is desired that the organic resin film 4 has a thickness of from 20 to 200 nm and, particularly, from 50 to 150 nm.

Referring next to FIG. 4(*d*), ceramic patterns having substantially the same thickness as the electrically conducting patterns 3 are formed among the electrically conducting patterns 3 by printing, via the organic resin film 4, the ceramic paste so as to substantially eliminate a difference in level caused by the thickness of the electrically conducting patterns 3.

The resin component of the ceramic paste may be either the one of the same composition as the electrically conducting paste forming the electrically conducting patterns 3 or the one of the ceramic paste of various compositions. Particularly, however, it is desired that the resin component of the ceramic paste has the same composition as the electrically conducting paste from the standpoint of employing the same conditions as those for printing the electrically conducting paste and bringing the rate of volatilization of the resin component from the surface of the ceramic green sheet 1 into agreement.

Further, the ceramic powder composition used for the ceramic slurry may be either the powder composition of the ceramic green sheet 1 or the ceramic paste of a different powder composition. From the standpoint of enhancing the adhesion between the ceramic green sheet 1 and the ceramic pattern and bringing the coefficient of contraction due to firing into agreement, however, it is desired that the ceramic paste has the same ceramic powder composition as the ceramic slurry for forming the ceramic green sheet 1.

It is desired that the ratio of ceramic material contained in the ceramic slurry is not larger than 80% and it is, particularly, desired that the amount of the organic solvent is from 20 to 70% by weight from such a standpoint that the solvent does not infiltrate into the neighboring electrically conducting patterns.

The organic solvent used here is desirably the same as the organic solvent used for the electrically conducting paste.

Figure 5A:
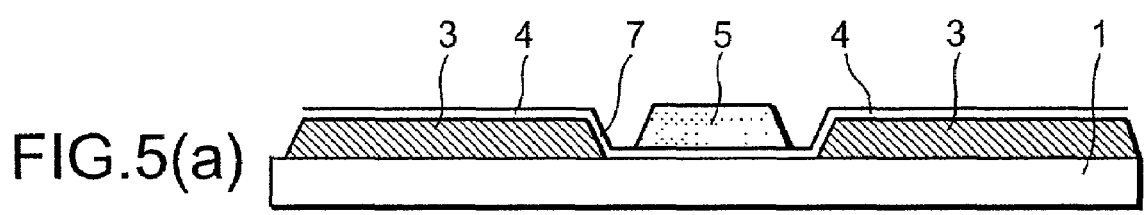
FIG. 5 is a sectional view schematically illustrating a state where the ceramic patterns are formed among the electrically conducting patterns on the ceramic green sheet according to the second invention.
Figure 5B:
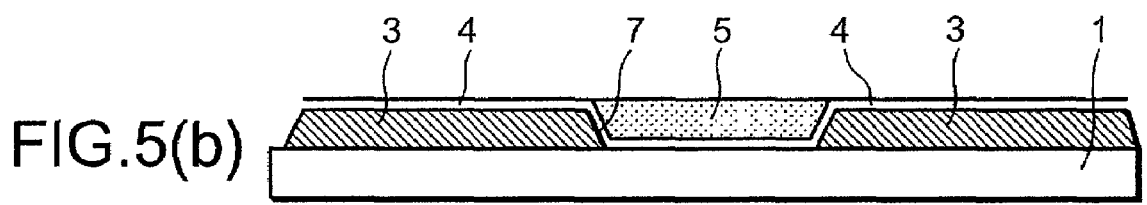
Figure 5C:
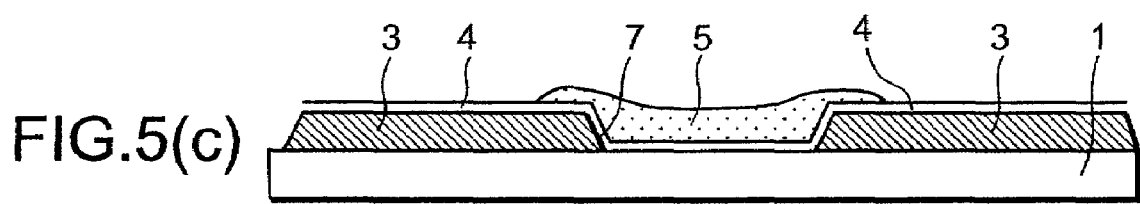

If in flush with the surfaces of the electrically conducting patterns 3, the ceramic patterns 5 formed among the electrically conducting patterns 3 on which the organic resin film 4 in formed, may be separated away from the ends of the inclined surfaced 7 of the organic resin film 4 as shown in FIG. 5 (a), or may be in contact with the inclined surfaces 7 of the organic resin film 4 as shown in FIG. 5(b). As shown in FIG. 5(c), however, the ceramic patterns 5 may ride on the upper surfaces of the electrically conducting patterns 3 and of the organic resin film 4 as seen in the peripheral regions of the printing pattern, since the riding portions of the ceramic patterns 5 can be removed at the time of pressing the laminate.

Figure 4A:
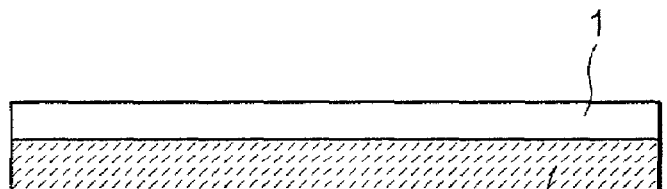
FIG. 4 is a view illustrating the steps for producing a ceramic laminate according to a second invention.
Figure 4B:
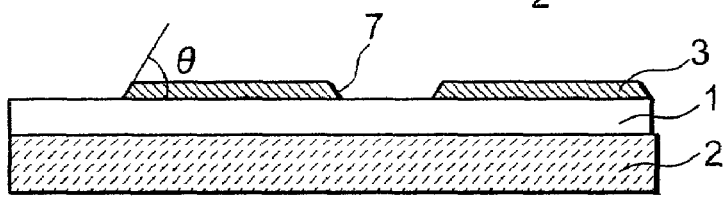
Figure 4C:
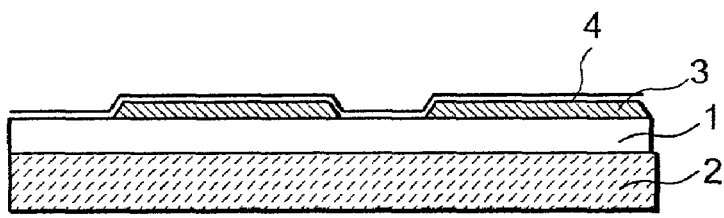
Figure 4D:
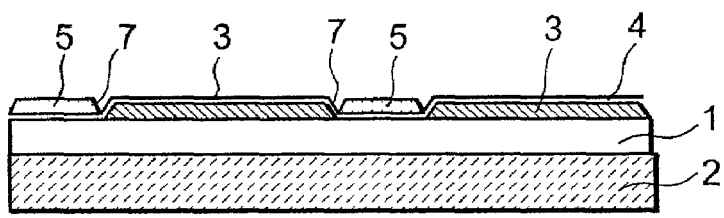
Figure 4E:
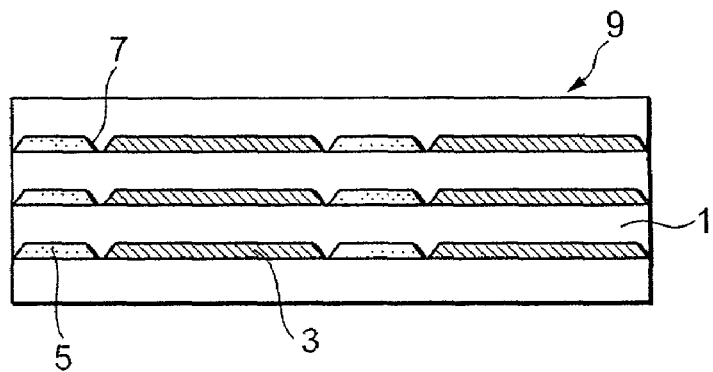

Referring next to FIG. 4(e), the carrier film 2 is peeled off the ceramic green sheet 1 on which the organic resin film 4, electrically conducting patterns 3 and ceramic patterns 5 are formed. The ceramic green sheets 1 are laminated in a plural number to form a temporarily laminated article which is then pressed while being heated at a temperature higher than a temperature at which the organic resin film 4 melts, thereby to form a laminate 9.

Here, in order that the ceramic patterns 5 riding on the ends of the electrically conducting patterns 3 easily migrate to among the electrically conducting patterns 3 when heated and pressed, it is desired that the organic resin film 4 melts more easily than the ceramic green sheets 1, electrically conducting patterns 3 and ceramic patterns 5, and that the glass transition point of the resin component contained in the organic resin film 4 is lower than that of the ceramic green sheets 1, electrically conducting patterns 3 and ceramic patterns 5.

The laminate 9 is cut into laminated molded articles which are, then, fired in a predetermined atmosphere under predetermined temperature conditions to form a plurality of laminated ceramic capacitors which are ceramic laminates.

According to the production method of the second invention as described above, even when the ceramic patterns 5 are formed riding on the upper surfaces of the electrically conducting patterns 3 in, for example, the peripheral portions of the printing screen, the ceramic patterns 5 migrate into among the electrically conducting patterns 3 together with the organic resin film 4 due to the heating and pressing at the time of lamination, whereby the surfaces of the electrically conducting patterns 3 become nearly in flush with the surfaces of the ceramic patterns 5 eliminating a difference in level caused by the electrically conducting patterns 3, suppressing the ceramic laminate from being deformed and preventing the occurrence of delamination and voids.

This makes it possible to improve the production yield of, for example, laminated ceramic capacitors which are ceramic laminates.

Figure 6:
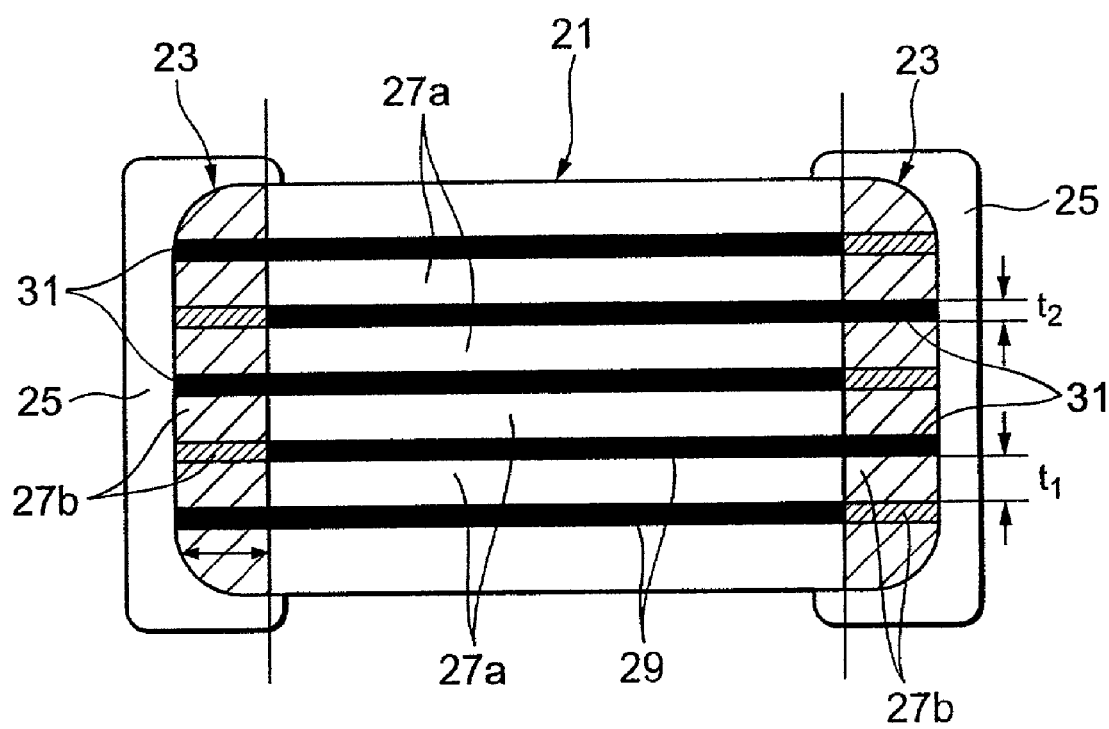
FIG. 6 is a sectional view schematically illustrating a third invention (laminated electronic part)

Next, a laminated electronic part according to the third invention will be described in connection with a laminated ceramic capacitor shown in FIG. 6.

In the laminated ceramic capacitor of the third invention, non-capacity portions 23 that do not exhibit dielectric properties are integrally formed on both side surfaces of a capacity portion 21 that exhibits dielectric properties, and a pair of outer electrodes 25 are provided at the exposed ends of the non-capacity portions 23.

The capacity portion 21 is constituted by alternately laminating dielectric ceramic layers 27a and inner electrode layers 29.

The non-capacity portions 23 are constituted by dielectric ceramic layers 27b and inner electrode layer-extending portions 31 extending from the inner electrode layers 29 which are formed in the capacity portion 21, the inner electrode layers 29 formed in the capacity portion 21 being in flush with the inner electrode layer-extending portions 31 formed in the non-capacity portions 23 without a difference in level.

In other words, the inner electrode layers 29 are alternately connected to the outer electrode 25 through the inner electrode layer extending portions 31. Dielectric ceramic layers 27b having nearly the same thickness as the inner electrode layers 29 are formed on the side of the outer electrode 25 for the inner electrodes 29 that are not connected to the outer electrode 25.

The dielectric ceramic layers 27a constituting the capacity portion 21 have a thickness of not larger than 3 µm from the standpoint of decreasing the thickness of the layers and laminating many layers for realizing the laminated electronic part of a small size yet having a large capacity and, desirably, have a thickness of from 1.5 to 3 µm from the standpoint of accomplishing a large capacity and a highly dielectric property.

On the other hand, the dielectric ceramic layers 27b constituting the non-capacity portions 23 have a thickness smaller than that on the side of the capacity portion 21 to a degree which enhances the junction on the interface between the inner electrode layers and the dielectric ceramic layers 27a constituting the capacity portion 21, and which does not hinder the flush relationship between the inner electrode layer-extending portions 31 and the inner electrode layers 29.

It is desired that the width W of the non-capacity portions 23 is not larger than 100 µm from the standpoint of increasing the effective areas of the inner electrode layers 29 constituting the capacity portion 21 and increasing the electrostatic capacity, and is, more desirably, in a range of from 50 to 100 μm from the standpoint of reliably improving resistance against moisture.

Figure 7:
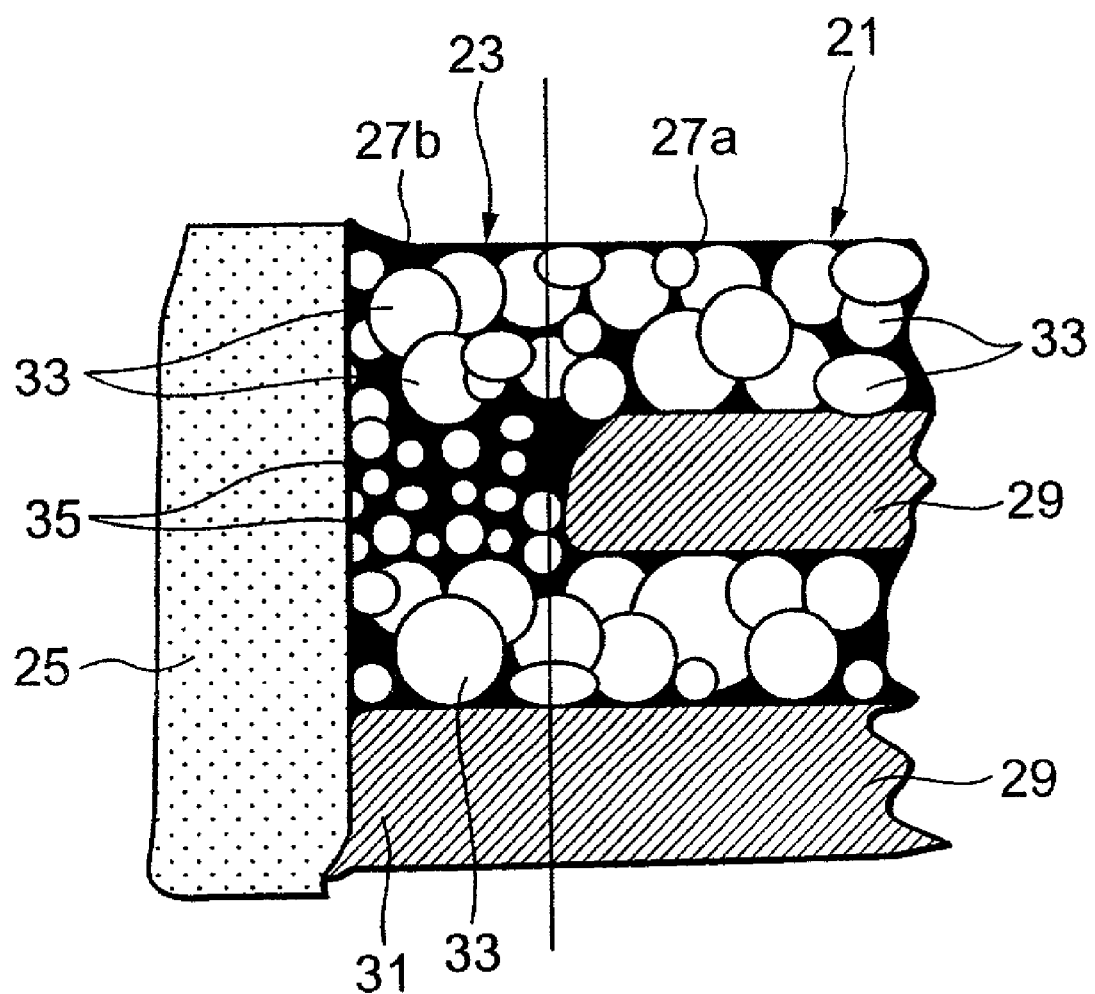
FIG. 7 is a diagram schematically illustrating, on an enlarged scale, a capacity portion and a non-capacity portion constituting the laminated electronic part according to the third invention.
Figure 9:
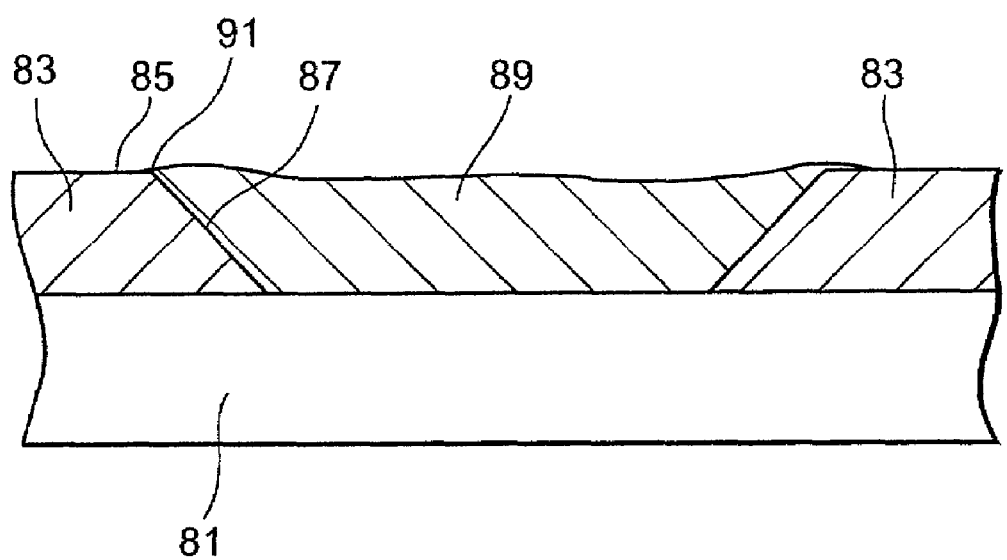
FIG. 9 is a sectional view schematically illustrating conventional ceramic patterns formed on a ceramic green sheet in a manner to be overlapped on the electrically conducting patterns.

Referring to FIG. 7, the dielectric ceramic layer 27a forming the capacity portion 21 is constituted by a mixed phase of a glass phase 35 and dielectric particles 32 such as of barium titanate. When a base metal is used as the inner electrode layers 29, in particular, the firing must be conducted in a reducing atmosphere making it necessary to use a material having resistance against reduction.

It is desired that the dielectric ceramic layer 27b forming the non-capacity portion 23, too, is constituted by a mixed phase of the glass phase 35 and dielectric particles 33 such as of barium titanate, and that the temperature at which the capacity portion 21 starts contract due to firing is brought close to the temperature at which the non-capacity portions 23 start contract due to firing, so that the dielectric properties of the capacity portion 21 will not be affected.

Here, it is desired that the dielectric ceramic layers 27b of the non-capacity portions 23 are more highly sintered than the capacity portion 21. For this purpose, it is desired that the amount of the glass in the non-capacity portions 23 is larger than the amount of the glass in the capacity portion 21.

It is further desired that the dielectric particles 33 in the dielectric ceramic layers 27a constituting the capacity portion 21 have an average particle diameter of not smaller than 0.2 μm. In the highly laminated ceramic capacitor formed by laminating not less than 200 layers, it is desired that the dielectric particles 33 in the dielectric ceramic layers 27a constituting the capacity portion 21 is from 0.3 to 0.8 μm the standpoint of maintaining a large dielectric constant and a high insulating resistance despite the thickness of the dielectric ceramic layers 27a in the capacity portion 21 constituted by the dielectric particles 33 is decreased.

On the other hand, the dielectric particles 33 constituting the dielectric ceramic layers 27b of the non-capacity portions 23 by an average particle diameter smaller than that of the dielectric particles 33 constituting the dielectric ceramic layers 27a of the capacity portion 21 from the standpoint of exhibiting a large strength, and is, desirably, not larger than 0.45 μm and, particularly, from 0.1 to 0.45 μm.

Further, the glass phase 35 in the dielectric ceramic layers 27a constituting the capacity portion 21 is constituted by an amorphous phase which contains an alkali metal oxide and is constituted chiefly by $SiO_2$, CaO and BaO. The glass phase 35 exists among the dielectric particles 33 and is forming a compound such as of the BaSiO type relative to the dielectric particles 33.

The dielectric ceramic layers 27b constituting the non-capacity portions 23, too, contain the glass phase 35 like that of the capacity portion 21. The glass phase 35 heightens the density of the non-capacity portions 23 to improve the mechanical strength.

It is further desired that the glass phase 35 is contained in the dielectric ceramic layers 27a constituting the capacity portion 21 in an amount of from 0.2 to 5% by weight and, particularly, from 0.9 to 2.6% by weight from the standpoint of bringing the coefficient of contraction into agreement between the dielectric ceramic layers 27a and the inner electrode layers 29.

It is further desired that the amount of the glass contained in the dielectric ceramic layers 27b constituting the non-capacity portions 23 is larger than the amount of the glass contained in the dielectric ceramic layers 27a constituting the capacity portion 21, and is from 0.8 to 25% by weight and, particularly, from 2.7 to 14.1% by weight.

When the content of the glass phase in the capacity portion 21 is denoted by $Gc_1$ and the content of the glass phase contained in the non-capacity portions 23 by $Gc_2$, it is desired that the weight ratio $Gc_1/Gc_2$ is in a range of from 0.03 to 0.9.

The inner electrode layers 29 are formed of a metal film obtained by sintering a film of an electrically conducting paste. As the electrically conducting paste, for example, there is used such a base metal as nickel, cobalt or copper.

The inner electrode layers 29 using the base metal as a chief phase, are conductor films of a nearly rectangular shape. The inner electrode layers 29 of odd numbers, i.e., first layer, third layer, fifth layer, - - - from the above are connected to the inner electrode layer-extending portions 31, and the ends of the inner electrode layer-extending portions 31 on one side are exposed on the one end surface of non-capacity portion 23. The inner electrode layers 29 of the second layer, fourth layer, sixth layer, - - - from the above are connected to the inner electrode layer-extending portions 31 on the other side, and the ends of the inner electrode layer-extending portions 31 on the other side are exposed on the other end surface of the non-capacity portion 23.

The outer electrodes 25 and the inner electrode layers 29 need not necessarily be constituted by the same material.

It is desired that the inner electrode layers 29 have a thickness of not larger than 2 μm and, particularly, from 0.5 to 1.5 μm from the standpoint of decreasing the amount of metal contained in the inner electrode layers 29 and maintaining a sufficiently large effective area.

When the thickness of the dielectric ceramic layers 27a constituting the capacity portion 21 is denoted by $t_1$ and the thickness of the inner electrode layers 29 is denoted by $t_2$, the thickness ratio of the dielectric ceramic layers 27a to the inner electrode layers 29 constituting the capacity portion 21 is $t_2/t_1 > 0.2$ and $t_2 < 2$ μm. In this case, the dielectric ceramic layers 27b constituting the non-capacity portions of the laminated electronic part of the third invention can be preferably adapted. In order to suppress the delamination caused by an excess thickness of the inner electrode layers 29, it is desired that the thickness ratio $t_{2/t1}$ is from 0.2 to 0.75.

The end of the inner electrode layer 29 formed on the dielectric ceramic layer 27a may form an inclined surface defining an acute angle with respect to the dielectric ceramic layer 27a, and the dielectric ceramic layer 27b of the non-capacity portion 23 may be so formed as to be overlapped on the peripheral edge of the inner electrode layer 29.

To realize the laminated electronic part in a small size yet having a large capacity, it is desired that the number of the layers in the laminated electronic part of the third invention is not smaller than 100 from such a standpoint that the dielectric ceramic layers 27a, 27b are laminated in many number having a decreased thickness to constitute the laminated electronic part, that a high adhering force is maintained among the dielectric ceramic layers 27a, 27b in the areas where there are no inner electrode layers 29 despite a difference in level due to the thickness of the inner electrode layers 29 is built up between a portion where the inner electrodes 29 are formed and a portion where they are not formed on the dielectric ceramic layers 27a, 27b, and that the delamination and cracks are suppressed.

Finally, described below is a method of producing the laminated electronic part according to the fourth invention in connection with the production of the above-mentioned laminated ceramic capacitor.

Referring to FIG. 8(a), a dielectric green sheet 41 having a thickness of 1.5 to 4 μm that serves as a dielectric ceramic layer 27a is produced relying upon the slip casting method.

Concrete examples of the slip casting method include pulling method, doctor blade method, reverse roll coater method, gravure coater method, screen printing method, gravure printing method and die coaster method.

It is desired that the dielectric green sheet 41 has a thickness of from 2.5 to 4 μm from the standpoint of accomplishing a small size, a large capacity and a highly insulating property.

As a concrete example of the dielectric material, a ceramic powder such as of $BaTiO_3$—MnO—MgO—$Y_2O_3$ is used because of its resistance against the reduction. Further, a glass powder is added as a sintering assistant to the dielectric powder.

It is desired that the dielectric powder used for the dielectric green sheet 41 has an average particle diameter of not larger than 1.5 μm from the standpoint of decreasing the thickness of the dielectric green sheet 41, and, particularly, from 0.1 to 0.9 μm from the standpoint of accomplishing a highly dielectric property and a highly insulating property.

A glass powder is preferably added together with the dielectric powder to the dielectric green sheet 41 since the SiO—CaO—BaO glass containing an alkali metal oxide suppresses the effect upon the dielectric property, and works to increase the coefficient of contraction upon firing and to increase the density.

It is desired that the amount of the glass powder contained in the dielectric green sheet 41 is from 0.5 to 5% by weight with respect to the dielectric powder from the standpoint of improving the sintering property and dielectric property of the dielectric green sheet 41, and, particularly, from 1 to 3% by weight from the standpoint of increasing the density, mechanical strength and dielectric property of the dielectric ceramic layers 27a.

It is further desired that the glass powder used for the dielectric green sheet 41 has an average particle diameter of not larger than 1.5 μm from the standpoint of highly sintering the dielectric green sheet 41 so as to acquire a high density and, particularly, from 0.1 to 0.9 μm from the standpoint of accomplishing a highly dielectric property and a highly insulating property.

The $BaTiO_3$ powder which is a principal starting material of the dielectric powder is synthesized by a solid phase method, a liquid phase method (method passing through an oxalic acid or the like method) or a hydrothermally synthesizing method. Among them, it is desired to employ the hydrothermally synthesizing method from the standpoint of a narrow particle size distribution and a high degree of crystallinity.

It is therefore desired that the $BaTiO_3$ powder has an average specific surface area of from 1.1 to 10 $m^2/g$.

Referring next to FIG. 8(b), inner electrode patterns 43 are formed on the surface of the dielectric green sheet 41 by printing an electrically conducting paste by a known printing method such as screen printing method, gravure printing method or offset printing method.

It is desired that the thickness thereof is not larger than 2 μm and particularly, not larger than 1.5 μm from the standpoint of realizing the capacitor in a small size maintaining a high reliability.

It is desired that the electrically conducting paste contains metal particles, an organic solvent which is a mixture of aliphatic hydrocarbons and a higher alcohol, an organic sticking agent comprising an ethyl cellulose soluble in the above organic solvent, and an organic binder comprising an epoxy resin sparingly soluble in the organic solvent.

As the metal particles contained in the electrically conducting paste, there are used base metal particles having an average particle diameter of from 0.05 to 0.5 μm.

As the base metal, there can be used nickel, cobalt or copper. Among them, it is desired to use nickel from such a standpoint that the temperature for firing the metal is in agreement with the temperature for firing dielectrics in general and that the cost is low.

The base metal particles desirably have an average particle diameter in a range of from 0.1 to 0.5 μm for improving the dispersion of the metal powder and for preventing the metal from agglomerating during the firing.

From a standpoint of forming a metal film which is dense having a smooth surface, it in desired that the base metal has an average particle diameter of from 0.15 to 0.4 μm.

In order to suppress the sintering property of the inner electrode patterns 43, it is desired to mix, as a solid component, a fine dielectric powder to the electrically conducting paste in addition to adding a metal powder. It is further desired that the dielectric powder has a particle diameter of from 0.05 to 0.3 μm for uniformalizing the particle diameter and for improving the smoothness of the inner electrode layers 29.

It is further desired that the epoxy resin is contained in the electrically conducting paste in an amount of from 0.05 to 1.5% by weight with respect to the ethyl cellulose that is contained together therewith.

Referring next to FIG. 8(c), dielectric patterns 45 are formed by applying a dielectric paste onto the surface of the dielectric green sheet 41 among the inner electrode patterns 43.

The dielectric paste is applied by a known method such as screen printing method, gravure printing method, offset printing method, ink jet method or relief printing.

The dielectric patterns 45 have a thickness that corresponds to the thickness of the inner electrode patterns 43.

It is desired that the dielectric paste for forming the dielectric patterns 45 contains a glass powder in large amounts, so that the dielectric green sheet 41 and the dielectric patterns 45 are formed integrally together exhibiting enhanced sintering property.

The dielectric powder contained in the dielectric paste has an average particle diameter which is usually nearly the same as that of the dielectric powder used for the dielectric green sheet 41 but, desirably, has an average particle diameter smaller than that of the dielectric powder used for the dielectric green sheet 41 and, desirably, not larger than 1 μm and, particularly, from 0.05 to 0.7 μm from the standpoint of easily controlling the coefficient of contraction upon firing in relation to the dielectric ceramic layers 27 and inner electrode layers 29 and increasing the mechanical strength without permitting abnormal growth of particles.

The glass powder added to the dielectric patterns 45 together with the dielectric powder is the one obtained by adding an alkali metal oxide to the SiO—CaO—BaO glass like the one added to the dielectric green sheet 41, in order to bring the coefficients of contraction upon firing into agreement and to accomplish a high density.

The softening point of the glass powder can be varied by changing the amount of the alkali metal oxide.

The glass powder is used for the dielectric paste in an amount of from 1 to 25% by weight with respect to the dielectric powder from the standpoint of enhancing the sintering property and mechanical strength of the dielectric ceramic layers 27b in the non-capacity portions 23 suppressing the occurrence of cracks and delamination and, particularly, in an amount of from 3 to 15% by weight from the standpoint of enhancing the resistance against heat and shock.

It is desired that the glass powder used for the dielectric paste has an average particle diameter of not larger than 1.5 µm from the standpoint of accomplishing a highly sintering property and a high density as compared to the glass powder used for the dielectric green sheet 41 and, particularly, has an average particle diameter of from 0.07 to 0.7 µm for imparting a large strength to the non-capacity portions 23.

It is further desired that the softening point of the glass powder used for the dielectric paste is lower than the softening point of the glass powder used for the dielectric green sheet 41, whereby the dielectric ceramic layers 27b in the non-capacity portions 23 contract more greatly than the dielectric ceramic layers 27a in the capacity portion 21 to acquire a high density and a large strength suppressing the occurrence of delamination and cracks.

The dielectric paste contains a dielectric powder containing an alkali metal oxide used for the dielectric green sheet 41, an SiO—CaO—BaO glass powder, an organic solvent of a mixture of aliphatic hydrocarbons and a higher alcohol, an organic sticking agent comprising an ethyl cellulose soluble in the above organic solvent, and an organic sticking agent comprising an epoxy resin sparingly soluble in the above organic solvent.

The dielectric paste may be applied onto tho peripheries of the inner electrode patterns 43 to form the dielectric green sheet 41 on the upper surface, or may be transferred onto the peripheries of the inner electrode patterns 43 on the dielectric green sheet 41.

Referring next to FIG. 8(*d*), a plurality of pieces of the dielectric green sheets 41 on which the electrically conducting paste is applied are laminated and are pressed for the first time at a temperature of 25 to 80° C. with the application of pressure of 0.1 to 10 MPa to obtain a temporarily laminated article.

Here, the laminated dielectric green sheets 41 have not been completely adhered together but are leaving gaps enabling the air to be removed to a sufficient degree during the next lamination of the second time.

This is because the epoxy resin has a high glass transition point Tg (120° C.) and is not plasticized through the heating at 25 to 80° C. and pressing.

Next, the temporarily laminated article is subjected to the lamination and pressing of the second time at a temperature of 90 to 130° C. under a pressure of 10 to 100 MPa so as to be completely adhered together, thereby to obtain a laminated article.

In the laminated article or the present invention, the dielectric patterns 45 are formed together with the inner electrode patterns 43 on the main surface on one side of the dielectric green sheets 41 forming the inner electrode patterns 43. During the pressing for lamination, therefore, the dielectric green sheets 41 and the inner electrode patterns 43 are not deformed despite of heat and pressure, and the laminated article is obtained.

Next, the laminated article is cut like a lattice to obtain molded articles of electronic parts.

Ends on one side of the inner electrode patterns 43 that form the inner electrode layers 29 and inner electrode layer-extending portions 31 are alternately exposed on both end surfaces of the molded article.

The molded articles of electronic parts are not limited to those obtained by the above method but may be those obtained by such a method as slurry dipping provided the dielectric green sheets 41 and the inner electrode patterns 43 having decreased thicknesses are alternately laminated.

Next, the molded articles of electronic parts are deashed in an atmosphere at 250 to 300° C. or in a low oxygen atmosphere having an oxygen partial pressure of from 0.1 to 1 Pa and are fired in a non-oxidizing atmosphere at 1200 to 1300° C. for 2 to 3 hours.

As desired, further, the reduced electronic parts are oxidized through a re-oxidation processing conducted under a low oxygen pressure of an oxygen partial pressure of about 0.1 to $10^{-4}$ Pa at 900 to 1100° C. for 5 to 15 hours, thereby to obtain electronic parts having a large electrostatic capacity and highly dielectric properties.

Finally, the end surfaces of the obtained electronic parts are coated with a Cu paste and are plated with Ni/Sn to form an outer electrode 26 electrically connected to the inner electrode layer-extending portions 31, thereby to obtain laminated ceramic capacitors.

The laminated ceramic capacitor produced by the method of the fourth invention as described above is the one in which the non-capacity portions 23 constituted by the dielectric ceramic layers 27b and the inner electrode layer-extending portions 31 formed by extending the inner electrode layers 29a, are formed integrally on the side surfaces of the capacity portion 21 constituted by alternately laminating the dielectric ceramic layers 27a and the inner electrode layers 29, wherein the inner electrode layers 29 and the inner electrode layer-extending portions 31 in the non-capacity portions 23 are forming a flush surface without substantially a difference in level, and the dielectric ceramic layers 27b in the non-capacity portions 23 are constituted by ceramics which can be more highly sintered than the dielectric ceramic layers 27a in the capacity portion 21. This eliminates a difference in level caused by the inner electrode layer-extending portions 31 in the non-capacity portions 23. Besides, the non-capacity portions 23 are more highly sintered than the capacity portion 21, making it possible to enhance the mechanical strength in the vicinities of the interlace between the dielectric ceramic layers 27b and the inner electrode layer-extending portions 31 and to prevent the occurrence of delamination and cracks in the peripheries of the inner electrode layers.

According to the method of producing ceramic laminates of the first invention as described above in detail, the ceramic paste is applied maintaining a distance so will not to be overlapped on the inclined surfaces at the ends of the electrically conducting patterns. Even when the position is deviated during the printing, therefore, a difference in level is almost all eliminated owing to the ceramic patterns formed among the electrically conducting patterns. Therefore, the ceramic green sheets that are laminated are suppressed from falling down among the electrically conducting patterns, preventing the occurrence of delamination and cracks.

Even when the ceramic paste is expanded up to the peripheral portions due to the pressure of the printing screen and the position is deviated during the printing, a margin is provided for maintaining a positional precision between the electrically conducting patterns and the ceramic patterns, making it possible to reliably form the ceramic patterns among the electrically conducting patterns. Even when a ceramic laminate is formed by laminating a many number of the ceramic green sheets on which the electrically conducting patterns and the ceramic patterns are formed, the ceramic laminate is suppressed from being deformed.

According to the method of producing ceramic laminates of the second invention, further, even when the ceramic patterns are formed riding on the upper surfaces or the electrically conducting patterns formed in the peripheral regions of the printing screen, the ceramic patterns migrate to among the electrically conducting patterns together with the organic resin film due to the heat and pressure at the time of lamination. Therefore, the electrically conducting patterns and the ceramic patterns are formed nearly in flush suppressing the ceramic laminate from being deformed and preventing the occurrence of delamination and voids.

In the laminated electronic part of the present invention, the inner electrode layers and the inner electrode layer-extending portions are forming a flush surface without substantially a difference in level. Besides, the dielectric ceramic layers constituting the non-capacity portions are constituted by ceramics that can be more highly sintered than the dielectric ceramic layers constituting the capacity portion. This makes it possible to eliminate a difference in level caused by the inner electrode layer-extending portions in the non-capacity portions. Besides, the non-capacity portions are more highly sintered than the capacity portions, and the mechanical strength is increased near the interface between the dielectric ceramic layers and the inner electrode layers preventing the occurrence of delamination and cracks in the vicinities of the inner electrode layers.

EXAMPLE 1

A laminated ceramic capacitor which is a ceramic laminate was produced in a manner as described below.

To 100 mol parts of a composition comprising 99.5 mol % of $BaTiO_3$ and 0.5 mol % of MnO, there were added 0.5 mol parts of $Y_2O_3$ and 0.5 mol parts of MgO. To 100 parts by weight of this ceramic component was added 55% by weight of a vehicle comprising 5.5% by weight of an ethyl cellulose and 94.5% by weight of a petroleum alcohol. The mixture was kneaded by using a three-roll mill to prepare a ceramic slurry which was, then, applied onto a belt-like carrier film of a polyester by a die coater method to prepare a ceramic green sheet.

An electrically conducting paste was prepared by kneading 45% by weight of a nickel powder having a particle diameter of 0.2 µm, and 55% by weight of a vehicle comprising 5.5% by weight of an ethyl cellulose and 94.5% by weight of a petroleum alcohol by using a three-roll mill.

A ceramic paste for forming ceramic patterns was prepared by pulverizing part of the above ceramic slurry until the $BaTiO_3$ possessed a particle diameter of 0.5 µm so as to assume a paste-like consistency like the electrically conducting paste. When the viscosity of the ceramic paste at a shearing rate of 0.01 $s^{-1}$ was denoted by $\eta_1$ and the viscosity of the ceramic paste at a shearing rate of 100 $s^{-1}$ was denoted by $\eta_2$, the ratio $\eta_2/\eta_1$ was changed from 10 to 15. The differences in the SP values of the sticking agents between the ceramic paste and the green sheet were as shown in Table 1.

Next, the above-mentioned electrically conducting paste was printed in the shape of a rectangular pattern onto the main surface of the ceramic green sheet obtained by using a screen printer having a square printing screen of a side of 150 mm, and was dried to form electrically conducting patterns having average thicknesses as shown in Table 1.

In this case, the angle of the inclined surfaces at the outer peripheral ends of the electrically conducting patterns was varied from 1° to 30°.

By using the square printing screen having a side of 150 mm, the ceramic paste was printed onto the ceramic green sheet among the electrically conducting patterns maintaining gaps $L_2$ to the electrically conducting patterns as shown in Table 1, and was dried to prepare ceramic green sheets on which have been formed the electrically conducting patterns as well as the ceramic patterns. The angle $\theta_2$ of the inclined surfaces at the outer peripheral ends of the ceramic patterns was varied from 0.5° to 40°.

The angle $\theta_1$ subtended by the inclined surface at the outer peripheral end of the electrically conducting pattern and by the inclined surface at the outer peripheral end of the ceramic pattern was varied as shown in Table 1.

Next, the ceramic green sheets of a number of 300 were laminated one upon another. Next, the ceramic green sheets of a number of 10 having neither the electrically conducting patterns nor the ceramic patterns were laminated on both the upper surface and the lower surface thereof. The laminate was subjected to the first time of pressing to form a temporarily laminated article. The temporarily laminated article prepared under these conditions was in a state where the ceramic green sheets had not been completely adhered together but possessed small space in a portion surrounded by the electrically conducting patterns, ceramic patterns and green sheets.

Next, the temporarily laminated article was subjected to the second time of pressing at a temperature of 100° C. under a pressure of 20 MPa to laminate and completely adhere the ceramic green sheets having the electrically conducting patterns applied thereon as well as the ceramic green sheets laminated thereon and thereunder which were formed of the same material as the above ceramic green sheets, thereby to obtain a mother laminate.

The mother laminate forming the ceramic laminate of the invention possessed ceramic patterns together with the electrically conducting patterns formed on the main surfaces on one side of the ceramic green sheets having the electrically conducting patterns. In the step of lamination by press, therefore, the ceramic green sheets or the electrically conducting patterns were not deformed by the heat or pressure, and there was obtained a mother laminate.

Next, the mother laminate was cut into a lattice to obtain ceramic laminated articles. The ceramic laminated articles were separated into those formed at the central porion of the mother laminate and those formed in the peripheral portions.

In this case, the area within a radius of 40 mm from the center of the mother laminate was regarded to be the central portion and other areas were regarded to be the peripheral portions.

The ends of the inner electrically conducting patterns were alternately exposed on both end surfaces of the ceramic laminated article.

Next, the ceramic laminated article was heated and dashed in the atmosphere at 250° C. or in an oxygen/nitrogen atmosphere of 0.1 Pa at 500° C.

Further, the ceramic laminated article after deashed was fired in an oxygen/nitrogen atmosphere of $10^{-7}$ Pa at 1250° C. for 2 hours and was then oxidized again in an oxygen/nitrogen atmosphere of $10^{-2}$ Pa at 900° C. for 4 hours to obtain a ceramic laminate. After the firing, a copper paste was fired on the end surfaces of the ceramic sintered body 900° C. followed by the plating with Ni/Sn to thereby form outer conductors connected to the inner conductors.

The thus obtained laminated ceramic capacitor possessed an outer size of 0.8 mm wide and 1.6 mm long. There was no difference in level caused by the inner conductors. The inner conductors were not curved but were flat.

Next, the laminated ceramic capacitors after firing in a number of 300 formed in the central portion of the mother laminate and the laminated ceramic capacitors after firing in a number of 300 formed in the peripheral portions of the mother laminate, were observed by using a binocular microscope of a magnification of 40 times to evaluate the presence of cracks in the end surfaces of the laminated ceramic capacitors. Further, the end surfaces and side surfaces of the laminated ceramic capacitors were polished to evaluate the presence of delaminations in the edge portions of the inner conductors.

Further, the angle $\theta_1$ subtended by the electrically conducting pattern and the ceramic pattern formed on the ceramic green sheet and the elevation angle $\theta_2$ of the ceramic pattern, were measured by using a probe-type surface roughness meter.

The results were as shown in Table 1.

TABLE 1

| Sample No. | Gap $L_2$ (μm) | Angle ($\theta_o^1$) | Conductor pattern thickness (μm) | $\eta_2/\eta_1$ | Difference in SP | Center Voids (number) | Center Delaminations (number) | Periphery Voids (number) | Periphery Delaminations (number) |
|---|---|---|---|---|---|---|---|---|---|
| 1-*1 | −50 | 170 | 2 | 10 | 1 | 1/300 | 1/300 | 72/300 | 81/300 |
| 1-*2 | 0 | 170 | 2 | 10 | 1 | 1/300 | 0/300 | 25/300 | 35/300 |
| 1-3 | 5 | 170 | 2 | 10 | 1 | 1/300 | 2/300 | 2/300 | 3/300 |
| 1-4 | 10 | 170 | 2 | 10 | 1 | 1/300 | 0/300 | 0/300 | 0/300 |
| 1-5 | 30 | 170 | 2 | 10 | 1 | 0/300 | 0/300 | 0/300 | 0/300 |
| 1-6 | 50 | 170 | 2 | 10 | 1 | 0/300 | 1/300 | 0/300 | 0/300 |
| 1-7 | 50 | 130 | 2 | 12 | 1 | 0/300 | 0/300 | 0/300 | 0/300 |
| 1-8 | 50 | 100 | 2 | 15 | 1 | 0/300 | 0/300 | 0/300 | 0/300 |
| 1-9 | 50 | 170 | 1 | 10 | 1 | 1/300 | 0/300 | 0/300 | 0/300 |
| 1-10 | 100 | 170 | 2 | 10 | 1 | 0/300 | 0/300 | 0/300 | 0/300 |
| 1-11 | 150 | 170 | 2 | 10 | 1 | 0/300 | 0/300 | 0/300 | 0/300 |
| 1-12 | 170 | 170 | 2 | 10 | 1 | 1/300 | 1/300 | 1/300 | 2/300 |
| 1-13 | 170 | 170 | 2 | 10 | 2 | 1/300 | 5/300 | 1/300 | 7/300 |

Samples marked with * lie outside the scope of the invention.

It is learned from the results of Table 1 that in the samples Nos. 1-3 to 1-13 forming ceramic patterns maintaining a distance among the electrically conducting patterns in the laminated ceramic capacitor, voids and delamination after firing were small in the samples from the central portion as well as in the samples from the peripheral portions of the mother laminate. In the samples Nos. 1-5 to 1-11 in which the gap between the electrically conducting patterns and the ceramic patterns was in a range of from 30 to 150 μm, in particular, voids and delamination were not almost observed.

In the samples Nos. 1-1 and 1-2 in which the gaps between the electrically conducting patterns and the ceramic patterns were set to be 0 and −50 (length of overlapping on the electrically conducting patterns inclusive of the inclined surfaces), there developed voids, delamination and IR defect much. In the sample No. 1-1 in which the ceramic patterns were overlapped on the ends of the electrically conducting patterns over 50 μm, in particular, voids and delamination developed much in the samples from the peripheral regions.

EXAMPLE 2

A laminated ceramic capacitor was produced in a manner as described below.

To 100 mol parts of a composition comprising 99.5 mol % of $BaTiO_3$ and 0.5 mol % of MnO, there were added 0.5 mol parts of $Y_2O_3$ and 0.5 mol parts of MgO. To 100 parts by weight of this ceramic component was added 55 parts by weight of a vehicle comprising 5.5% by weight of a polyvinyl butyral, 1.7% by weight of a plasticizer and 92.8% by weight of a petroleum alcohol. The mixture was kneaded by using a ball mill to prepare a ceramic slurry which was, then, applied onto a belt-like carrier film of a polyester by a die coater method to prepare a ceramic green sheet. The thickness of the ceramic green sheet was adjusted to be about 2.5 μm.

An electrically conducting paste was prepared by kneading 45% by weight of a nickel powder having an average particle diameter of 0.2 μm, and 55% by weight of a vehicle comprising 5.5% by weight of an ethyl cellulose and 94.5% by weight of a petroleum alcohol by using a three-roll mill.

A slurry for forming an organic resin film was prepared by using a resin component (butyral: glass transition point of 80° C.) basically used for the preparation of a ceramic green sheet and a plasticizer. By varying the amount of addition of the plasticizer, the glass transition point was varied to be not higher than 80° C.

The amount of the resin component was 0 to 85% by weight. There was also prepared the slurry by using, as a resin component, an acrylic resin (glass transition point of 0° C.) instead of using the polyvinyl butyral.

There were thus formed an organic resin film in which the ratio of amounts of the resin component and the plasticizer was the same as that in the ceramic green sheet (described as "same" in Table), an organic resin film in which the amount of the plasticizer was smaller than that in the ceramic green sheet to heighten the glass transition point (described as "high" in Table 2) and an organic resin film in which the amount of the plasticizer was larger than that in the ceramic green sheet to lower the glass transition point (described as "low" in Table 2).

A ceramic paste for forming ceramic patterns was prepared by pulverizing part of the above ceramic slurry until the $BaTiO_3$ possessed an average particle diameter of 0.5 μm. Then, to 100 parts by weight of this ceramic powder, there was added 55 parts by weight of a vehicle comprising 5.5 by weight of an ethyl cellulose and 94.5% by weight of a petroleum alcohol while using the same resin component as that of the electrically conducting paste. The mixture was kneaded by using a three-roll mill to obtain a paste thereof.

Next, the above-mentioned electrically conducting paste was printed in the shape of a rectangular pattern onto the main surface of the ceramic green sheet that was obtained by using a screen printer having a square printing screen of a side of 150 mm, and was dried to form electrically conducting patterns.

In this case, the angle θ of the inclined surfaces at the outer peripheral ends of the electrically conducting patterns was about 20°.

Further, the slurry for forming the organic resin film was applied onto the ceramic green sheet on which the electrically conducting patterns have been formed by using a die coater so as to possess a thickness of 20 to 300 nm, i.e., applied onto the whole surfaces of the electrically conducting patterns and onto the ceramic green sheet among the electrically conducting patterns.

Next, by using the square printing screen having a side of 150 mm, the ceramic paste was printed onto the ceramic green sheet among the electrically conducting patterns and was dried to prepare ceramic green sheets on which have been formed the electrically conducting patterns as well as the ceramic patterns.

Here, the width of the ceramic patterns was designed to be corresponded to the width among the electrically conducting patterns. In the peripheral portions of the printing screen, however, the ceramic patterns were formed riding on the upper surfaces at the ends of the electrically conducting patterns. The electrically conducting patterns and the ceramic patterns were formed to possess substantially the same thickness.

Next, the ceramic green sheets were peeled off the carrier films. The ceramic green sheets of a number of 300 were laminated. Further, the ceramic green sheets of a number of 10 having neither the electrically conducting patterns nor the ceramic patterns were laminated on both the upper surface and the lower surface thereof. The laminate was subjected to the first time of pressing to form a temporarily laminated article.

Next, the temporarily laminated article was subjected to the second time of pressing at a temperature of 100° C. which was higher than the glass transition point of any one of the organic resin films prepared above under a pressure of 20 MPa to laminate and completely adhere the ceramic green sheets having the electrically conducting patterns applied thereon as well as the ceramic green sheets laminated thereon and thereunder formed of the same material as the above ceramic green sheets, thereby to obtain a laminate.

Next, the laminate was cut into a lattice to obtain laminated articles.

The laminated articles were separated into those formed at the centers of the laminate and those formed in the peripheral portions.

In this case, the area within a radius of 40 mm from the center or the laminate was regarded to be the central portion and other areas were regarded to be the peripheral portions.

Next, the laminated article was heated and deashed in an oxygen/nitrogen atmosphere of 0.1 Pa at 500° C.

Further, the laminated article after deashed was fired in an oxygen/nitrogen atmosphere of $10^{-7}$ Pa at 1250° C. for 2 hours and was then oxidized again in an oxygen/nitrogen atmosphere of $10^{-2}$ Pa at 900° C. for 4 hours to obtain a ceramic laminate. After the firing, a copper paste was fired on the end surfaces or the ceramic laminate at 90° C. followed by the plating with Ni/Sn to thereby form outer conductors connected to the inner conductors.

The thus obtained laminated ceramic capacitor possessed an outer size of 0.8 mm wide and 1.6 mm long. There was no difference in level caused by the inner conductors. The inner conductors were not curved but were flat.

Next, the laminated ceramic capacitors after firing in a number of 300 formed in the central portion of the laminate and the laminated ceramic capacitors after firing in a number of 300 formed in the peripheral portions of the laminate, were observed by using a binocular microscope of a magnification of 40 times to evaluate the presence of voids in the end surfaces of the laminated ceramic capacitors. Further, the end surfaces and side surfaces of the laminates ceramic capacitors were polished to evaluate the presence of delaminations in the edge portions of the inner conductors. The results were as shown in Table 2.

TABLE 2

| | | Organic resin film | | | | Center | | Periphery | |
| --- | --- | --- | --- | --- | --- | --- | --- | --- | --- |
| Sample No. | Resin | Resin amount (wt %) | Plasticizer amount (wt %) | Thickness (μm) | Glass transition point** | Voids (number) | Delamination (number) | Voids (number) | Delamination (number) |
| 2-*1 | — | — | — | 0 | — | 2/300 | 6/300 | 12/300 | 24/300 |
| 2-2 | butyral | 30 | 70 | 20 | low | 1/300 | 1/300 | 1/300 | 2/300 |
| 2-3 | butyral | 30 | 70 | 50 | low | 0/300 | 0/300 | 0/300 | 0/300 |
| 2-4 | butyral | 30 | 70 | 100 | low | 0/300 | 0/300 | 0/300 | 0/300 |
| 2-5 | butyral | 30 | 70 | 150 | low | 0/300 | 0/300 | 0/300 | 0/300 |
| 2-6 | butyral | 30 | 70 | 200 | low | 0/300 | 0/300 | 0/300 | 1/300 |
| 2-7 | butyral | 30 | 70 | 300 | low | 0/300 | 0/300 | 0/300 | 2/300 |
| 2-8 | butyral | 1 | 99 | 100 | low | 0/300 | 0/300 | 2/300 | 5/300 |
| 2-9 | butyral | 5 | 95 | 100 | low | 0/300 | 0/300 | 1/300 | 3/300 |
| 2-10 | butyral | 10 | 90 | 100 | low | 0/300 | 0/300 | 0/300 | 0/300 |
| 2-11 | butyral | 50 | 50 | 100 | low | 0/300 | 0/300 | 0/300 | 1/300 |
| 2-12 | butyral | 75 | 25 | 100 | same | 0/300 | 0/300 | 0/300 | 2/300 |
| 2-13 | butyral | 85 | 15 | 100 | high | 0/300 | 0/300 | 0/300 | 4/300 |
| 2-14 | acrylic | 30 | 70 | 100 | low | 0/300 | 0/300 | 0/300 | 0/300 |

Samples marked with * lie outside the scope of the invention.
**Glass transition point is in comparison with the ceramic green sheet.

It is learned from the results of Table 2 that in the samples No. 2-2 to 2-14 forming the organic resin film on the ceramic green sheet that includes the electrically conducting patterns and forming ceramic patterns corresponding to the width among the electrically conducting patterns, the organic resin film migrates at the time of lamination whereby the surfaces of the electrically conducting patterns become in flush with the surfaces of the ceramic patterns developing little voids and delamination after firing in both the samples from the central portion of the laminate and the samples from the peripheral portions of the laminate.

In the samples Nos 2-3 to 2-6 and 2-8 to 2-14 in which the organic resin film possessed a thickness of from 50 to 200 nm, delamination was observed to a slight degree in the peripheral portions but no void or no delamination was observed in the central portion.

In the samples 2-3, 2-4 and 2-5 in which the resin component contained in the organic resin film was butyral, the ratio of the butyral to the plasticizer was 30:70, the glass transition point was lower than that of the ceramic green sheet and the organic resin film possessed a thickness of 50 to 150 nm, there developed quite no delamination or no void. Even when the acrylic resin was used as the resin component, there developed no delamination or no void.

In the sample 2-1 forming the ceramic patterns but without forming the organic resin film, voids and delamination developed much, particularly, in the peripheral portions.

EXAMPLE 3

A laminated ceramic capacitor was produced in a manner as described below.

To 100 mol parts of a composition comprising 99.5 mol % of $BaTiO_3$ and 0.5 mol % of MnO, there were added 0.5 mol % of $Y_2O_3$ and 0.5 mol % of MgO, and to which was further added a glass powder having a softening point and in an amount as shown in Table 3 to prepare a dielectric ceramic slurry. The dielectric ceramic slurry was applied onto a belt-like carrier film of a polyester by a die coater method to prepare a dielectric ceramic green sheet having a thickness of 3 μm.

The average particle diameter of the dielectric powder was that of the $BaTiO_3$ since the particle diameter was dominated by the $BaTiO_3$ powder that was contained in large amounts.

Here, the dielectric powder used in the dielectric green sheet possessed an average particle diameter of about 0.4 μm, and the glass powder possessed an average particle diameter of about 0.7 μm and a softening point of 680° C. These powders were added in amounts as shown in Table 3 to prepare a dielectric green sheet.

An electrically conducting paste was prepared by kneading 45% by weight of a nickel powder having an average particle diameter of 0.2 μm and 55% by weight of a vehicle comprising 5.5% by weight of an ethyl cellulose and 94.5% by weight of a petroleum alcohol by using a three-roll mill.

A dielectric paste for forming dielectric patterns was prepared by pulverizing part of the above dielectric ceramic slurry until the $BaTiO_3$ possessed an average particle diameter as shown in Table 3 like in the case of preparing an electrically conducting paste.

The glass powder contained the above-mentioned component possessed a softening point as shown in Table 3 and was added in an amount as shown in Table 3 to 100 parts by weight of the dielectric powder.

The glass powder possessed an average particle diameter of about 0.5 μm.

Next, as shown in FIG. 8(b), the above-mentioned electrically conducting paste was printed in the shape of inner electrode patterns onto the main surface of the dielectric green sheet that was obtained by using a screen printer, and was dried.

Referring next to FIG. 8(c), the dielectric paste was printed by screen printing onto the peripheries of the inner electrode patterns formed on the dielectric green sheet, and was dried to prepare a dielectric green sheet on which have been formed inner electrode patterns as well as dielectric patterns.

Referring next FIG. 8(d), the dielectric green sheets of a number of 200 were laminated. Further, the dielectric green sheets of a number of 10 having neither the inner electrode patterns nor the dielectric patterns were laminated on both the upper surface and the lower surface thereof to obtain a temporarily laminated article.

The temporarily laminated article obtained under these conditions was in a state where the dielectric green sheets had not been completely adhered together but leaving gaps permitting the air to be removed to a sufficient degree in the second time of lamination by pressing.

Next, the temporarily laminated article was subjected to the second time of lamination by pressing at a temperature of 100° C. under a pressure of 20 MPa to laminate and completely adhere the dielectric green sheets having the inner electrode patterns applied thereon as well as the dielectric green sheets laminated thereon and thereunder which were formed of the same material as the above dielectric green sheets, thereby to obtain a laminate.

The laminated article that was the laminated electronic part of the invention possessed inner electrode patterns together with the dielectric patterns formed on the main surfaces on one side of the dielectric green sheets having the inner electrode patterns. In the step of lamination by press, therefore, the dielectric green sheets or the inner electrode patterns were not deformed by the heat or pressure, and there was obtained a laminated article.

Next, the laminated article was cut into a lattice to obtain molded articles of electronic parts. The ends of the inner electrode patterns constituting the inner electrode layer-extending portions were alternately exposed on both end surfaces of the laminated article.

Next, the molded articles of electronic parts were heated and deashed in the atmosphere at 250° C. or in an oxygen/nitrogen atmosphere of 0.1 Pa to 500° C.

Further, the molded articles of electronic parts after deashed were fired in an oxygen/nitrogen atmosphere of $10^{-7}$ at 1250° C. for 2 hours and were then oxidized again in an oxygen/nitrogen atmosphere of $10^{-2}$ Pa at 900° C. for 4 hours to obtain the electronic parts.

After the firing, a copper paste was fired on the end surfaces of the ceramic sintered body at 900° C. followed by the plating with Ni/Sn to thereby form outer electrodes connected to the inner electrode layers.

The thus obtained laminated ceramic capacitor possessed an outer size of 0.8 mm wide and 1.6 mm long. There was no difference in level caused by the inner electrode layers. The inner electrode layers were not curved but were flat.

Next, the thus obtained laminated ceramic capacitors in a number of 1000 were observed by using a binocular microscope of a magnification of 40 times to evaluate the presence of cracks in the end surfaces of the laminated ceramic capacitors.

Further, the end surfaces and side surfaces of the sintered bodies of a number of 300 were polished to evaluate the presence of delamination in the edge portions of the inner electrode layers.

Further, the thus obtained laminated ceramic capacitors of a number of 300 were measured for their electrostatic capacities under the conditions of a frequency of 1.0 kHz and a measuring voltage of 0.5 Vrms to calculate an average value. Next, the samples of a number of 300 were subjected to the shock testing at a temperature ΔT of 280° C. in compliance with the JIS Standards to evaluate the number of cracks that developed.

Sectional surfaces of the laminated ceramic capacitors of a number of 10 were polished, thermally etched, and were observed by using an electron microscope (SRM). The image of the SEM photograph was analyzed to find the porosity in the dielectric ceramic layer constituting the capacity portion and non-capacity portions.

The amount of the glass was found by measuring silicon by using an analytical electron microscope (EPMA) on the basis of the composition or a standard sample.

The average particle diameter of the dielectric particles constituting the capacity portion of the laminated ceramic capacitors was 0.42 μm in all of the samples.

The dielectric powder ($BaTiO_3$ powder) and the glass powder used for the dielectric green sheet, and the dielectric powder ($BaTiO_3$ powder) and the glass powder used for the dielectric paste, were calculated by measuring 100 particles of the powders dispersed on a stage by using the electron microscope.

The results were as shown in Table 3.

TABLE 3

| | Before firing | | | After firing | | | |
|---|---|---|---|---|---|---|---|
| Sample No. | Amount of glass in dielectric green sheet (wt. parts) | Average particles diameter in dielectric paste (μm) | Glass softening point in dielectric paste (° C.) | Amount of glass in dielectric paste (wt parts) | Glass content in capacity portion (wt %) | Glass content in non-capacity options (wt %) | Average dielectric particle diameter in non-capacity portions (μm) |
| 3-1 | 1 | 0.4 | 680 | 1.2 | 0.9 | 1.11 | 0.42 |
| 3-2 | 1 | 0.4 | 680 | 1.5 | 0.9 | 1.4 | 0.42 |
| 3-3 | 1 | 0.4 | 680 | 3 | 0.9 | 2.7 | 0.42 |
| 3-4 | 1 | 0.4 | 680 | 5 | 0.9 | 4.4 | 0.42 |
| 3-5 | 1 | 0.4 | 680 | 10 | 0.9 | 9.3 | 0.42 |
| 3-6 | 1 | 0.4 | 680 | 15 | 0.9 | 14.1 | 0.42 |
| 3-7 | 1 | 0.4 | 680 | 20 | 0.9 | 18.9 | 0.42 |
| 3-8 | 1 | 0.4 | 680 | 25 | 0.9 | 23.6 | 0.42 |
| 3-9 | 3 | 0.4 | 680 | 5 | 2.6 | 4.3 | 0.42 |
| 3-10 | 5 | 0.4 | 680 | 7 | 4.4 | 6.2 | 0.42 |
| 3-11 | 1 | 0.4 | 580 | 1 | 0.9 | 0.9 | 0.42 |
| 3-12 | 3 | 0.4 | 580 | 3 | 2.7 | 2.7 | 0.42 |
| 3-13 | 3 | 0.2 | 680 | 3 | 2.7 | 2.7 | 0.28 |
| 3-14 | 3 | 0.3 | 680 | 3 | 2.7 | 2.7 | 0.35 |
| 3-15 | 1 | 0.2 | 680 | 3 | 0.9 | 2.7 | 0.28 |
| 3-16 | 1 | 0.3 | 680 | 3 | 0.9 | 2.7 | 0.35 |
| 3-*17 | 1 | 0.4 | 680 | 1 | 2.7 | 2.7 | 0.42 |
| 3-*18 | 1 | 0.4 | 680 | 0.5 | 0.9 | 0.42 | 0.42 |
| 3-*19 | 1 | 0.6 | 680 | 1 | 0.9 | 0.9 | 0.63 |

| | Properties | | | | | |
|---|---|---|---|---|---|---|
| Sample No. | Porosity in capacity portion (%) | Porosity in non-capacity portion (%) | Electrostatic capacity (LF) | Cracks (appearance) after firing (number) | Delamination (inside) (number) | Thermal shock testing (ΔT cracks) 280° C. (number) |
| 3-1 | 1.2 | 0.9 | 5 | 1/1000 | 0/300 | 1/300 |
| 3-2 | 1.2 | 0.7 | 5 | 0/1000 | 0/300 | 1/300 |
| 3-3 | 1.2 | 0.6 | 5 | 0/1000 | 0/300 | 1/300 |
| 3-4 | 1.2 | 0.5 | 5 | 0/1000 | 0/300 | 1/300 |
| 3-5 | 1.2 | 0.5 | 5 | 0/1000 | 0/300 | 1/300 |
| 3-6 | 1.2 | 0.7 | 5 | 0/1000 | 0/300 | 1/300 |
| 3-7 | 1.2 | 0.8 | 5 | 0/1000 | 0/300 | 1/300 |
| 3-8 | 1.2 | 1 | 5 | 0/1000 | 0/300 | 1/300 |
| 3-9 | 1 | 0.8 | 4.95 | 0/1000 | 0/300 | 2/300 |
| 3-10 | 0.6 | 0.4 | 4.9 | 0/1000 | 0/300 | 1/300 |
| 3-11 | 1.2 | 0.9 | 5 | 1/1000 | 1/300 | 3/300 |
| 3-12 | 1 | 0.4 | 4.95 | 0/1000 | 0/300 | 2/300 |
| 3-13 | 0.7 | 0.5 | 4.95 | 1/1000 | 0/300 | 3/300 |
| 3-14 | 0.8 | 0.6 | 4.95 | 2/1000 | 1/300 | 4/300 |
| 3-15 | 1.2 | 0.5 | 5 | 0/1000 | 0/300 | 0/300 |
| 3-16 | 1.2 | 0.6 | 5 | 0/1000 | 0/300 | 0/300 |
| 3-*17 | 1.2 | 1.2 | 5 | 5/1000 | 2/300 | 10/300 |
| 3-*18 | 1.2 | 2.1 | 5 | 12/1000 | 3/300 | 19/300 |
| 3-*19 | 1.5 | 1.7 | 5 | 4/1000 | 3/300 | 11/300 |

Samples marked with * lie outside the scope of the invention.

It is learned from the results of Table 3 that in the sample Nos. 3-1 to 3-10 in which the amount of the glass in the dielectric ceramic layers constituting the non-capacitor portions was larger than the amount of the glass in the dielectric ceramic layers constituting the capacitor portion, the electrostatic capacity has slightly decreased depending upon the amount of the glass in the dielectric ceramic layers in the samples No. 3-9 and 3-10. After the firing, however, the porosity in the non-capacity portions became smaller than the porosity in the capacity portion, and the sintering property was heightened.

Cracks and delamination were not almost observed. Even in the thermal shock testing, the frequency of cracks did not increase.

In the samples Nos. 3-11 and 3-12, too, in which the amount of the glass was the same in the dielectric ceramic layers constituting the non-capacity portions and the capacity portions, and the softening point of the glass powder in the dielectric paste was set to be lower than the softening point of the glass powder in the dielectric green sheet, the porosity in the non-capacity portions after firing became smaller than the porosity in the capacity portion, and the resistance was improved against the occurrence of cracks, delamination, and against the heat and shock.

In the samples Nos. 3-13 and 3-14, too, in which the amount of the glass was the same in the dielectric ceramic layers constituting the non-capacity portions and the capacity portion, and the average particle diameter of the dielectric powder in the dielectric paste was set to be smaller than the average particle diameter in the dielectric green sheet, the porosity became small, and the resistance after firing was improved against the occurrence of cracks and delamination.

In the samples No. 3-15 and 3-16 in which the average particle diameter of the dielectric powder in the dielectric paste was set to be smaller than the average particle diameter in the dielectric green sheet, and the amount of the glass in the dielectric ceramic layers constituting the non-capacity portions was selected to be larger than the amount of the glass in the dielectric ceramic layers constituting the capacity portion, the laminated ceramic capacitors possessed increased electrostatic capacities. Cracks, delamination and ΔT cracks in the thermal shock testing were all eliminated after the firing.

In the sample No. 3-17 in which the amount of the glass, softening point of the glass powder, and the average particle diameter of the dielectric particles were all maintained the same in the dielectric ceramic layers constituting the non-capacity portions and the capacity portions, the coefficients of contraction due to firing were close and the porosity was the same between the non-capacity portions and the capacity portion. Due to a large coefficient of contraction due to firing of the inner electrode layer-extending portions, therefore, the junction strength was weak in the interface between the inner electrode layer-extending portions and the dielectric ceramic layers, and the cracks and delamination have increased. Since the mechanical strength was small, in particular, the frequency of occurrence of cracks has increased in the thermal shock testing.

In the sample No. 3-18 in which the amount of addition of the glass in the dielectric paste in the non-capacity portions was smaller than the amount of addition of the glass in the dielectric green sheet and in the sample No. 3-19 in which the dielectric powder used for the dielectric paste possessed a large average particle diameter, the porosity in the non-capacity portions after firing became smaller than the porosity in the capacity portion, and the cracks and delamination have further increased.

The invention claimed is:

1. A method of producing ceramic laminates comprising steps of:
   forming a ceramic green sheet by applying a ceramic slurry onto a carrier film;
   forming a plurality of electrically conducting patterns having inclined surfaces at ends thereof by printing an electrically conducting paste onto a main surface of said ceramic green sheet and maintaining a predetermined gap between said electrically conducting patterns;
   forming ceramic patterns having inclined surfaces at ends thereof among said electrically conducting patterns by printing a ceramic paste maintaining a distance as gap of not smaller than 10 μm from said electrically conducting patterns; and
   laminating two or more ceramic green sheets, each having said electrically conducting patterns and said ceramic patterns formed thereon.

2. The method of producing ceramic laminates according to claim 1, wherein an angle $\theta_1$ subtended by the inclined surface at the end of the electrically conducting pattern and by the inclined surface at the end of the ceramic pattern is in a range of from 120° to 179°.

3. The method of producing ceramic laminates according to claim 1, wherein the angle $\theta_2$ of the inclined surface at the end of the ceramic pattern lies within a range of from 0.5° to 40°.

4. The method of producing ceramic laminates according to claim 1, wherein when a viscosity of the ceramic paste at a shearing rate of 0.01 s$^{-1}$ is denoted by $\eta_1$ and a viscosity of the ceramic paste at a shearing rate of 100 s$^{-1}$ is denoted by $\eta_2$, there holds a relation $\eta_1/\eta_2 > 5$.

5. The method of producing ceramic laminates according to claim 1, wherein a difference in the SP value between an organic binder contained in the ceramic paste and an organic binder contained in the ceramic green sheet is not larger than 2.

6. The method of producing ceramic laminates according to claim 1, wherein the electrically conducting patterns have a thickness which is not larger than 3 μm.

7. The method of producing ceramic laminates according to claim 1, wherein the thickness of the electrically conducting patterns is substantially the same as the thickness of the ceramic patterns.

* * * * *